United States Patent [19]

Yamashita et al.

[11] Patent Number: 5,521,536
[45] Date of Patent: May 28, 1996

[54] INTEGRATED CIRCUIT DEVICE HAVING DIFFERENT SIGNAL TRANSFER CIRCUITS FOR WIRINGS WITH DIFFERENT LENGTHS

[75] Inventors: Hiroki Yamashita, Hachioji; Hiroyuki Itoh, Akigawa; Atsumi Kawata, Hiratsuka; Tatsuya Saitoh, Kokubunji; Keiichirou Nakanishi, Tokyo; Rieko Ishida, Hamura; Tsuneyo Chiba, Kanagawa-ken, all of Japan

[73] Assignee: Hitachi, Ltd., Tokyo, Japan

[21] Appl. No.: 286,270

[22] Filed: Aug. 5, 1994

[30] Foreign Application Priority Data

Aug. 6, 1993 [JP] Japan .................................. 5-195842

[51] Int. Cl.⁶ ............................................. H03K 19/0175
[52] U.S. Cl. ............................ 326/82; 326/101; 326/30; 326/21
[58] Field of Search .................... 326/93, 17, 21, 326/30, 101, 82, 86, 90; 365/190; 333/20

[56] References Cited

U.S. PATENT DOCUMENTS 4,853,899  8/1989  Kitsukawa et al. ............... 365/190
5,093,587  3/1992  Zbinden ................................ 326/30
5,163,022  11/1992  Homma et al. ..................... 365/190
5,214,318  5/1993  Nakanishi et al. .................. 333/20

Primary Examiner—Edward P. Westin
Assistant Examiner—Jon Santamauro
Attorney, Agent, or Firm—Antonelli, Terry, Stout & Kraus

[57] ABSTRACT

In signal transmission lines among logic circuits employed in a semiconductor integrated circuit device, a voltage driver circuit is provided with such a wiring whose length is short, and the function of the signal receiving circuit is achieved by a logic circuit capable of responding to a voltage appearing at a terminal of the wiring. On the other hand, a source terminal of such a wiring whose length is long and whose resistance is high, is voltage-driven by the voltage driver circuit in response to the output voltage of the logic circuit. A current sense circuit is provided with a terminal of this long length wiring, which senses a current flowing through this long length wiring to be converted into a voltage. Both an output resistance of the voltage driver circuit and an input resistance of the current sense circuit are made lower than a DC resistance of this long length wiring.

39 Claims, 19 Drawing Sheets

F I G. 10
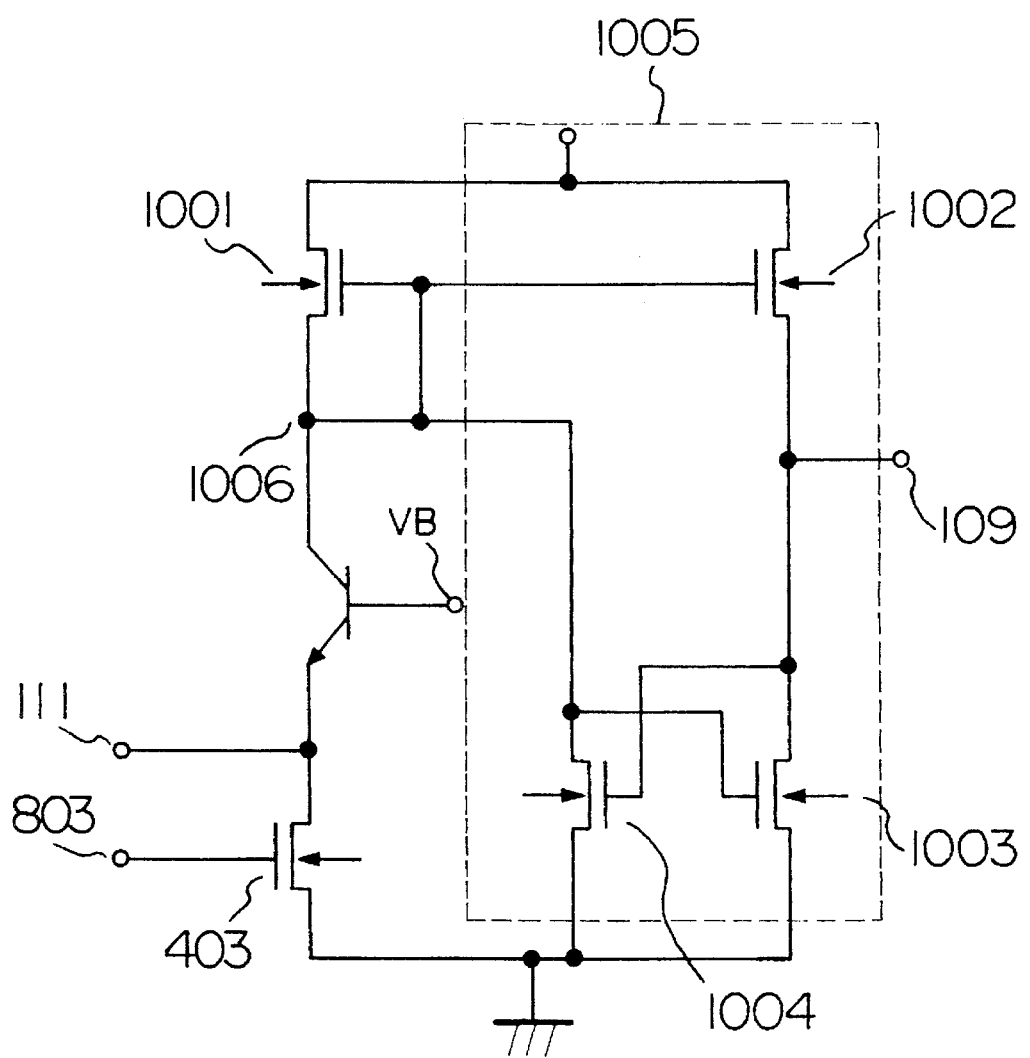

INTEGRATED CIRCUIT DEVICE HAVING DIFFERENT SIGNAL TRANSFER CIRCUITS FOR WIRINGS WITH DIFFERENT LENGTHS

BACKGROUND OF THE INVENTION

The present invention relates to signal transfer wirings formed on a semiconductor integrated device and, more specifically, to a high-speed, signal transfer method.

Recent emphasis has been towards increasing the density of semiconductor integrated circuit chips further, as well as increasing the areas of these chips. Accordingly, amounts of signal transmission lines used to connect logic circuits employed in the semiconductor integrated circuit are increased. In other words, the lengths of the signal wirings are increased. In addition to realizing such high integrating density and large areas, a line resistance associated with a wiring of a semiconductor integrated circuit is considerably increased since the widths of wirings are made narrower so as to achieve high integration. As a result, delay time caused by line resistance (simply referred to a "line resistance delay") is considerably increased, and thus this line resistance delay would occupy a substantial portion of signal propagation delay among the logic circuits. It is a major factor for increasing operation speeds of semiconductor integrated circuit devices to shorten such a line resistance delay.

As the signal transmission line for the conventional semiconductor integrated circuit, there are known a transmission scheme with an open-ended terminal, and a transmission scheme with a shortened terminal. For the signal wiring between the logic circuits, the open-ended terminal type transmission scheme has been widely employed in which no signal voltage drop caused by the line resistance appears, as represented in an equivalent circuit of FIG. 12. In this circuit, reference numerals 101 and 10b indicate logic circuits, namely reference numeral 101 is a driving circuit, and reference numeral 10b is a receiver circuit. Generally speaking, an emitter coupled logic circuit, so-called as an "ECL", in which bipolar transistors are employed as the driver circuit 101 and the receiver circuit 10b, and a CMOS circuit in which MOS transistors are employed as the driver circuit 101 and the receiver circuit 10b, have been widely utilized. In any of these circuits, the driving circuit 101 may be expressed by an equivalent voltage source 106 and an output resistor 105, and the output impedance of this circuit is several tens of ohms. The input impedance of the receiver circuit 10b is higher than several hundreds of Kilohms in the emitter coupled logic circuit where the input impedance is defined as the base input, whereas the input impedance of the CMOS logic circuit is the infinite, which is extremely large as compared with the wiring resistance. Thus, the driver circuit and the receiving circuit will actually constitute the open-ended terminal type transmission scheme.

In general, in such a transmission scheme in which wiring formed on an LSI (large-scale integration) has a line resistance which is relatively high, namely a distributed constant line (signal path) constructed of RC (resistors and capacitors), the rising time of a current waveform appearing at a line terminal when the line terminal is short-circuited is theoretically faster than the rising time of a voltage waveform appearing at the line terminal when the line terminal is open. This current waveform is called "Thomson's current curve", a detailed analysis of which is described in, for instance, Japanese publication entitled "Electric Circuit (2) in College Course" published by Ohm-Sha publisher, issued on May 30, 1969. This article describes such a case in which a DC voltage is applied to the limited length line, namely, it analyzes a case in which a limited length line is driven by an ideal voltage source.

Generally, when a transmission scheme with a shortened terminal is realized by employing the above-described ECL, an amplitude of a signal voltage appearing at the line terminal would be considerably lowered due to line resistance, as compared with that appearing at the source terminal. As a consequence, in a transmission scheme such, as shown in FIG. 13, the driver circuit is constituted by the current driver circuit and the receiver circuit is constituted by the current sensing circuit, as described in JP-A-2-265093. This drawing schematically represents a portion of the signal wirings of the sensing circuit for deriving the information stored in the memory cell. Reference numeral 1301 indicates a memory cell, and becomes a current driver circuit for supplying a read current Ir in correspondence with current supply capabilities of an MOS transistor 1308 in response to the information of the memory cell. At this time, since the MOS transistor 1308 is operated as the current source, the output resistance becomes substantially infinite. Reference numerals 1302 and 1303 denote signal wirings, reference numeral 1305 represents transistors functioning as terminal resistors, and reference numeral 1306 shows a current sensing circuit for converting the read current Ir into a corresponding voltage effected by the read current which flows through the resistor 1307. It should be noted that symbol "C" indicates a line capacitance per unit length, and symbol "R" shows a line resistance per unit length. Further, another conventional transmission scheme with a terminated receiving end is disclosed in JP-A-4-207226. Also, in this prior art system, the driver circuit is the current source, and thus the output resistance is considerably high.

SUMMARY OF THE INVENTION

In such a transmission scheme in which a signal path line is driven by a voltage signal and a line terminal is brought into an open condition, the line resistance delay is directly proportional to a product between a total line capacitance and a total line resistance, and then even when an output resistance Rs would be lowered as much as possible by improving the driver circuit, this line resistance delay could not be shortened below than a certain delay amount. Also, in the above-described prior art, namely the transmission scheme with the shortened terminal driven by the current source (Rs=o$\Omega$), the line resistance delay could not be shortened below than a certain delay amount even when the terminating resistor Rt would be lowered by improving the receiver circuit. In FIG. 14, there are shown either a voltage waveform appearing at the line terminal, or a current waveform appearing at the line terminal in such an ideal case that the output resistance Rs of the driver circuit is lowered to zero ohm in the conventional open-ended terminal type transmission scheme, and another ideal case that the terminal resistance Rt at the shortened terminal type transmission scheme is lowered to zero ohm. Even in the above-explained conventional open-ended terminal type transmission scheme and shortened terminal type transmission scheme, the time required in which the line resistance delay "tpdcr", namely the time that either the receiving end voltage, or the current at line terminal takes to effect an increase by 50%, could not be shortened below than a value expressed by the following equation (1):

$$tpdcr=0.38 \times R \times C \times L \times L \quad (1),$$

even in either ideal case (Rs=0 ohm, or Rt=0 ohm).

In other words, this time could not be shortened lower than approximately 40% of the product between the total line capacitance and the total line resistance. In the actual semiconductor circuit, there is another problem that since the output resistance Rs of the driver circuit is finite, another delay time is caused by this finite resistance and the line capacitance. When the above-described total line resistance is smaller than this output resistance, the time delay caused by the above-explained formula (1) may be endured. However, when the line resistance is increased, the time delay caused by the above-described formula (1) cannot be endured.

Also, in order to obtain the above-described Thomson's current curve, the signal line should be driven by the ideal voltage source (Rs=0 ohm) and also the line terminal should be shortened (Rt=0 ohm). However, when the line terminal is short-circuited, it is not easy to derive the signal from the short-circuited terminal. Furthermore, even when such a condition capable of substantially satisfying the ideal condition could be realized, namely Rs=zero ohm and Rt=zero ohm, the current flowing from the voltage source to the line terminal would normally become very large with respect to that of the semiconductor integrated circuit, resulting in a non-realistic current. For instance, assuming now that the amplitude of the signal of ECL is 500 mV and the line resistance is 100 ohms (approximately 2 mm), the current flowing through the line terminal becomes 5 mA. Currently, since the current flowing through the terminal is on the order of several hundreds of microamperes even in the bipolar transistor circuit, such a transmission scheme could not be directly applied in view of power consumption. Moreover, a means for converting a current into a voltage should also be considered to realize realistic transmission schemes in addition to a means for utilizing waveforms of high-speed currents, since a signal of a normal digital circuit is a voltage waveform.

Accordingly, an object of the present invention is to provide a semiconductor integrated circuit device in which a line resistance delay caused in such a signal wiring whose wiring length is long and thus whose line resistance becomes high, can be shortened.

Another object of the present invention is to provide a semiconductor integrated circuit device capable of shortening a line resistance delay caused in such a hybrid semiconductor integrated circuit with employment of signal wiring whose length is long, i.e., a high line resistance, and also signal wiring whose length is short, i.e., a low line resistance.

A more concrete object of the present invention is to provide a semiconductor integrated circuit device capable of shortening a line resistance delay caused in a semiconductor integrated circuit device which requires as wirings connected among different circuit blocks, a signal wiring whose length is long, i.e., line resistance being high, and also a signal wiring whose length is short, i.e., line resistance being low.

To achieve the above-described objects, in a semiconductor integrated circuit device, both of a voltage driver circuit for driving a starting end of signal wiring, and a current sense circuit positioned at a terminal of this signal wiring, for sensing a current flowing from the signal wiring to convert this sensed current into a voltage are utilized, and furthermore, both of an output resistance of the voltage driver circuit and an input resistance of the current sense circuit are made smaller than a DC resistance of the signal wiring with respect to such a signal wiring whose length is relatively long, i.e., higher wiring resistance. On the other hand, with regard to such a signal wiring whose length is relatively short, i.e., lower line resistance, both a voltage driver circuit located at a starting end of this signal wiring, and also a voltage sense circuit located at a terminal of this signal wiring are utilized.

In particular, the above-described current sense circuit and voltage sense circuit are properly selected with respect to a plurality of signal wirings having different lengths which bridge different circuit blocks.

In addition, a proper circuit selection is carried out for a circuit receiving a signal from half way of the same signal wiring as well as a selection from both of the above-described current sense circuit and voltage sense circuit when a signal is received from a terminal of this signal wiring.

BRIEF DESCRIPTION OF THE DRAWINGS

FIG. 10 schematically indicates another current sense circuit which includes a configuration CMOS, used in the semiconductor integrated circuit device shown in FIG. 1A and FIG. 1B;

FIG. 1B is constituted by MOS transistors;

DESCRIPTION OF THE PREFERRED EMBODIMENTS

Figure 19A:
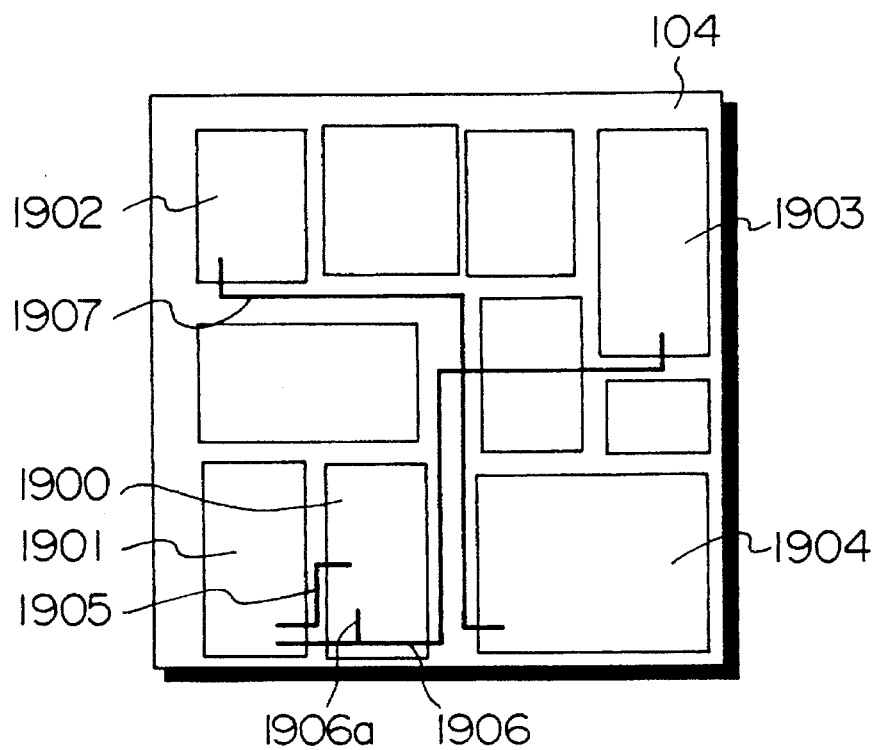
FIG. 19A schematically shows an arrangement of a semiconductor integrated circuit device constructed of a plurality of blocks, to which the present invention is applied.
Figure 19B:
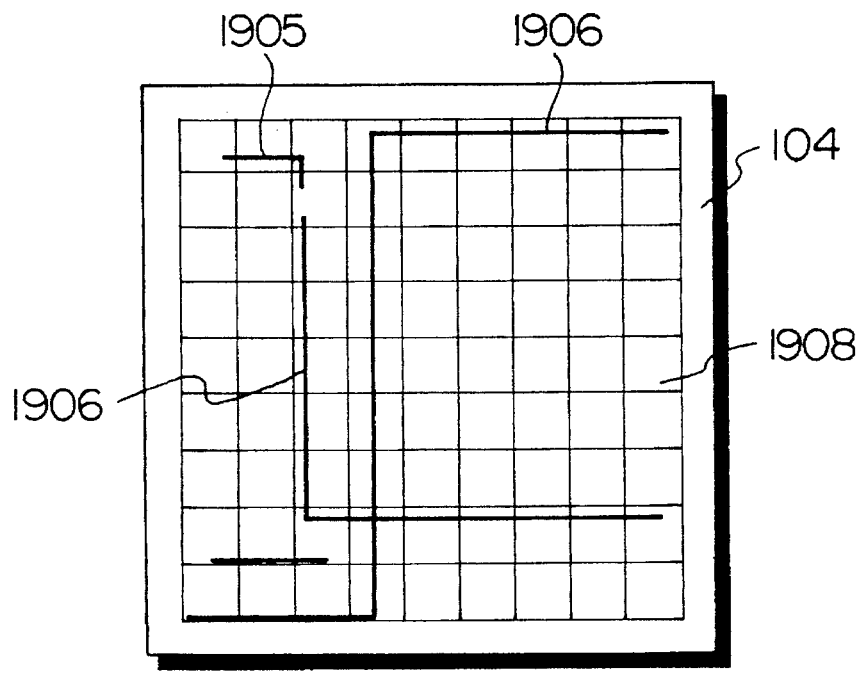
FIG. 19B schematically indicates an arrangement of a master slice type semiconductor integrated circuit device to which the present invention is applied.

Referring now to the drawings, a semiconductor integrated circuit (IC) device according to an embodiment of the present invention will be described. FIG. 19A and FIG. 19B show plan views of IC chips according to an embodiment of the present invention. In FIG. 19A, function blocks 1901, 1902, 1903, 1904 and so on are arranged on a semiconductor integrated circuit chip 104. These function blocks are mutually connected by way of wirings. For example, a short distance wiring 1905 is used to connect the block 1901 with the adjoining block 1900. On the other hand, a long distance wiring 1906 is employed to connect the function block 1901 to the function block 1903. A bus line 1907 is employed to connect the function block 1902 to the function block 1904. This bus line is used to send 32-bit data, 64-bit data, an address signal and the like. Although a large number of bus lines are arranged in a parallel mode, these bus lines may be arranged in a manner equivalent to the above-described long distance wiring 1906 in view of the wiring length.

Figure 12:
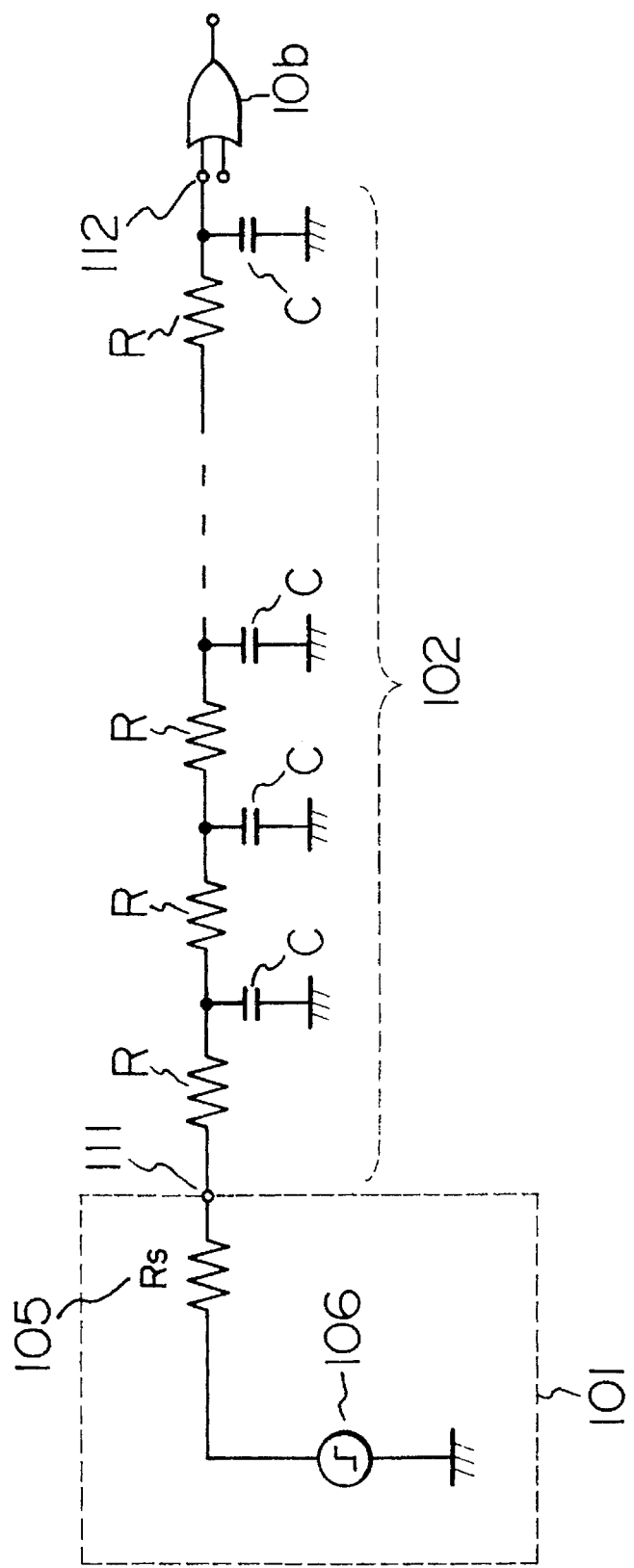
FIG. 12 is the equivalent circuit diagram of the conventional transmission scheme whose line terminal is open.
Figure 13:
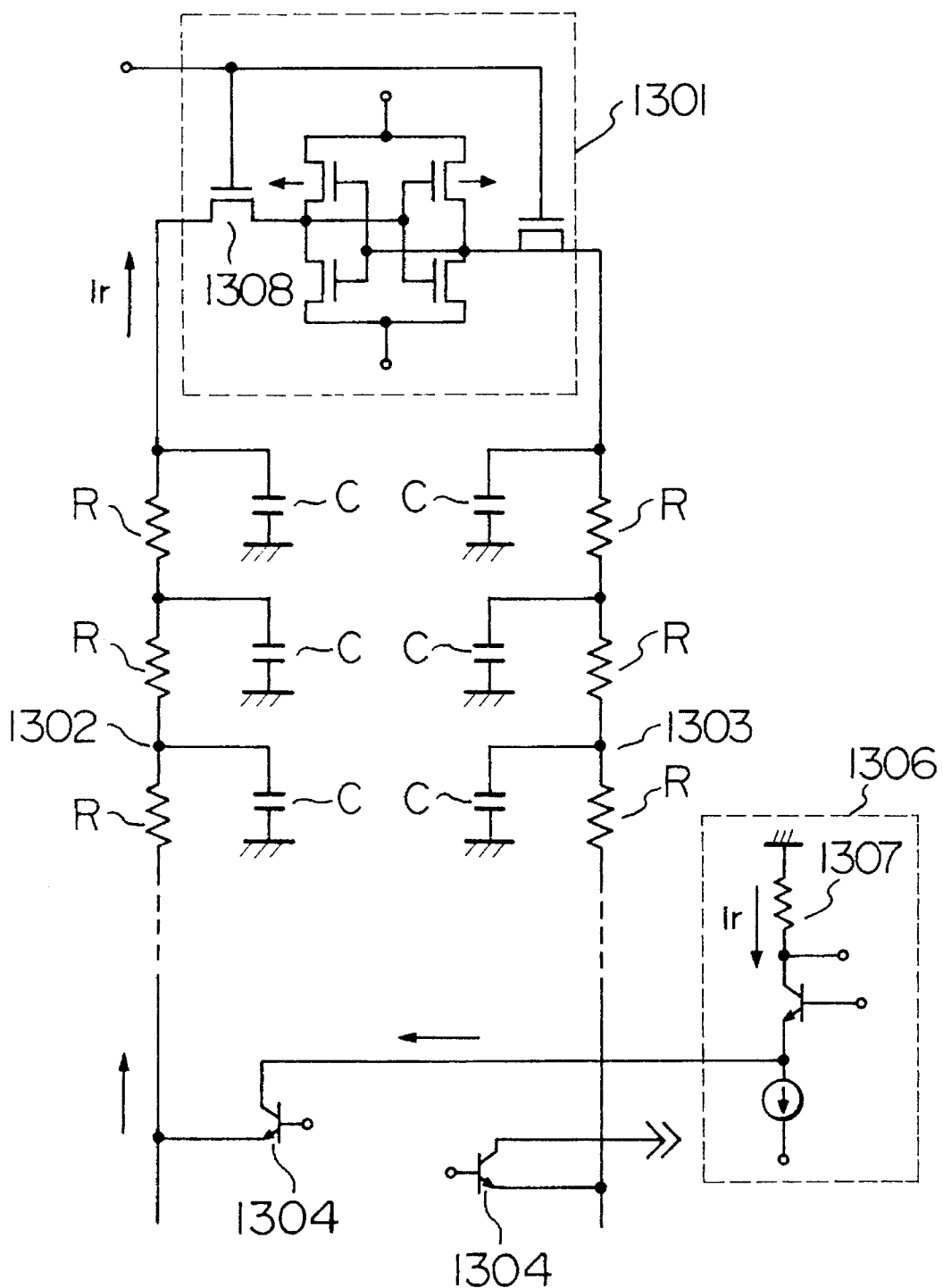
FIG. 13 schematically indicates the conventional signal transfer system including the signal receiver circuit whose line terminal is shortened.
Figure 14:
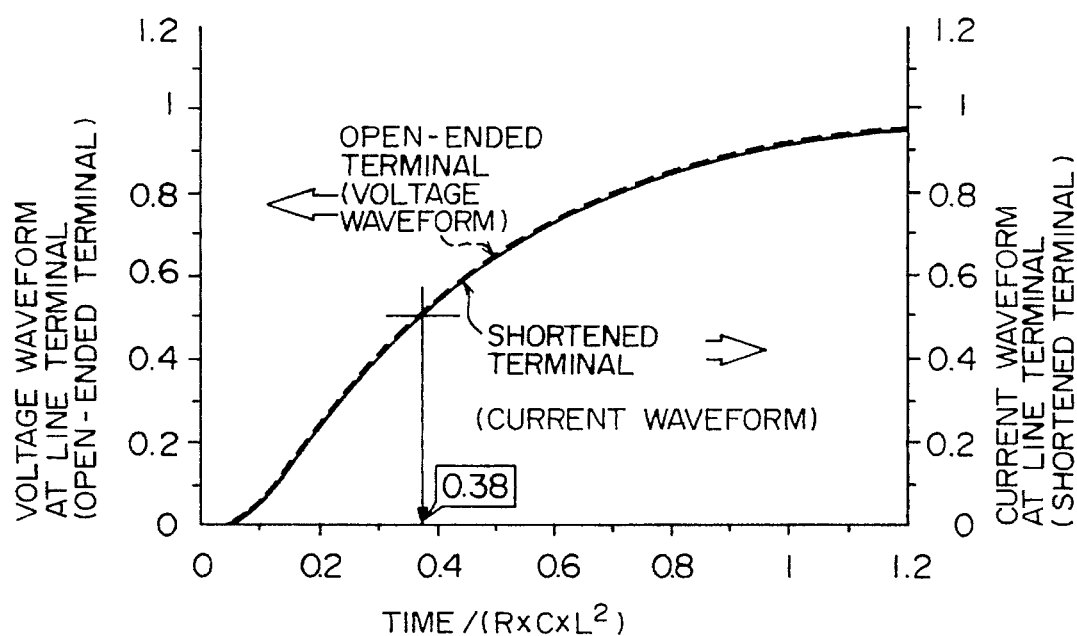
FIG. 14 is a graphic representation for indicating the waveforms of the current and the voltage appearing at the line terminal in such cases as that in which the terminal is open and the terminal is shortened.

The short distance wiring 1905 is driven in a similar manner to the conventional manner, namely the receiving end opening type transmission scheme as shown in FIG. 12. Both the long distance wiring 1906 and the bus line 1907 are driven by employing a terminated receiving end type transmission scheme driven by a voltage (will be described in detail), because of their large line resistance. A current flowing through the line terminal is defined by dividing a drive voltage appearing at a source terminal by a summation between line resistance and terminal resistance. Since the line resistance is large, the current value may be relatively made small. At the drive ends, the basically same voltage driver circuit system is employed for both of the short distance wiring and the long distance wiring.

It should be noted that the long distance wiring 1906 may be connected to the function block 1900 via another wiring 1906a which is branched from a half way of this long distance wiring 1906.

FIG. 19B schematically represents such a case in which a semiconductor integrated circuit chip 104 is a gate array. A basic cell 1908 is consists of an arrangement of a plurality of circuits, and a chip 104 consists of a plurality of basic cells 1908. The arrangements of the transistors provided in the respective basic cells 1908 are similar to each other. The basic cells may have different functions by varying the wirings and the like. As a consequence, the wirings among the basic cells 1908 are the same as in the case of FIG. 19A, and the driving methods for the short distance wiring 1905 and the long distance wiring 1906 may be made similar to the above-described method.

Figure 1A:
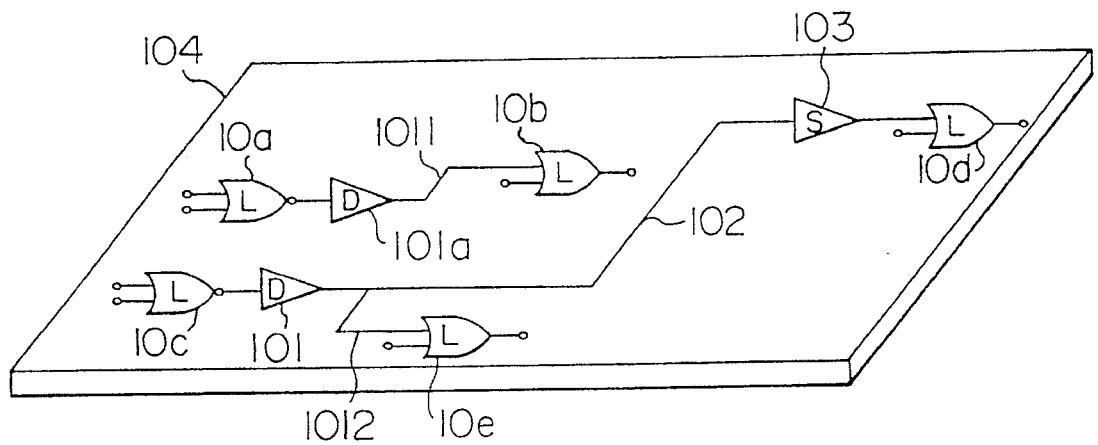
FIG. 1A schematically illustrates a structure of a semiconductor integrated circuit device according to an embodiment of the present invention.

FIG. 1A schematically indicates a basic structure of a semiconductor integrated circuit device 104 according to the embodiment of the present invention, or shows IC circuits to be used in FIG. 19A and FIG. 19B. Reference numerals 10a, 10b, 10c, 10d, and 10e show a portion of many logic circuits employed in this semiconductor integrated circuit device 104. These logic circuits may be arranged by using the known circuits, for example, circuits employing emitter coupled logic circuits (identical to an arrangement of a voltage driver circuit 101 shown in FIG. 6, will be described later).

Reference numerals 102, 1011 and 1012 indicate examples of wirings used to transfer signals among these logic circuits. More specifically, reference numeral 1011 shows an example of a short distance wiring connected between a logic circuit 10a and a logic circuit 10b, and reference numeral 1012 represents an example of another short distance wiring connected between a logic circuit 10c and a logic circuit 10e. Each of these logic circuits is constructed of a circuit for outputting a voltage signal in response to one, or a plurality of voltage signals which are inputted to this logic circuit. Reference numeral 102 shows an example of a long distance wiring connected between a logic circuit 10c and a logic circuit 10d. The signal wiring 1012 corresponds to such a wiring connected to a half way of the signal wiring 102, and also both these signal wirings 1012 and 102 are used to transfer the output from the same logic circuit 10c. The signal wiring 1011 corresponds to the short distance wiring 1905 shown in FIG. 19A and FIG. 19B. The signal wiring 102 corresponds to either the long distance wiring 1906, or the bus line 1907 shown in FIG. 19A and FIG. 19B, whereas the signal wiring 1012 corresponds to the signal wiring 1906a of FIG. 19A.

Reference numeral 101a shows a voltage driver circuit for applying a voltage depending on the output derived from the logic circuit 10a to the signal wiring 1011, and reference numeral 101 denotes another voltage driver circuit for applying a voltage depending upon the output derived from the logic circuit 10c to the signal wiring 102. Alternatively, any of these logic circuits may be used as these voltage driver circuit, depending upon case conditions.

Reference numeral 103 indicates a current sense circuit functioning as a signal receiver circuit employed at a terminal of the signal wiring 102.

At terminals of other signal wirings 1011 and 1012, such a current sense circuit is not provided, but logic circuits 10b, 10c such as NOR gate circuits are directly connected. Then, these logic circuits may have the same function as the receiver circuit for the signal wirings 1011 and 1012.

Figure 1B:
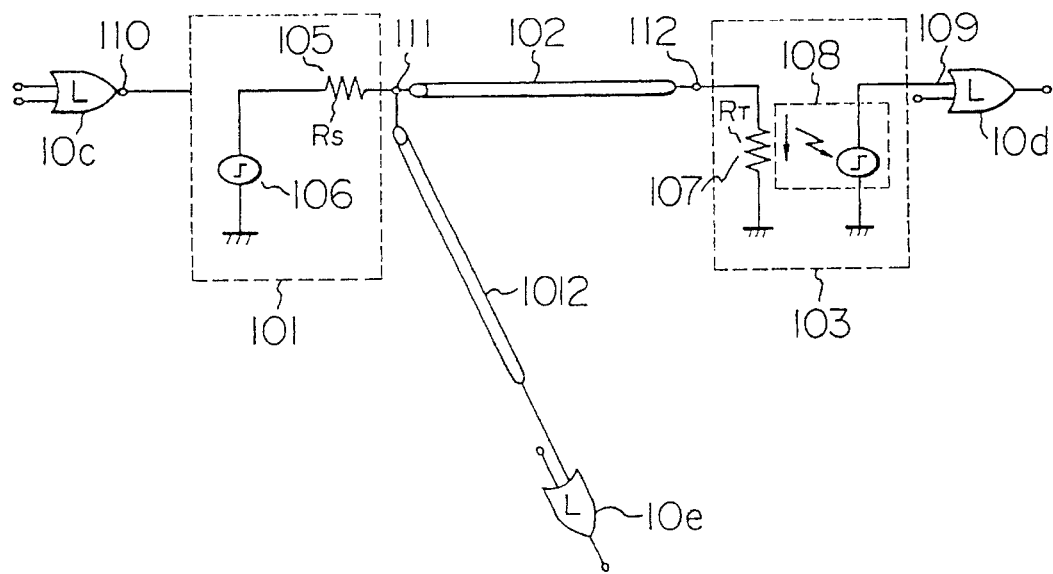
FIG. 1B is an equivalent circuit diagram of a circuit used in the semiconductor integrated circuit of the above-described embodiment.

As represented in the circuit 101 of FIG. 1B, in the voltage driver circuit 101, reference numeral 110 indicates an input terminal, reference numeral 111 shows a signal transfer end. This driver circuit 101 is equal to such a voltage driver circuit constructed of a voltage source 106 and an output resistor 105. The above-described arrangement may be similarly applied to another driver circuit 101a.

Figure 2:
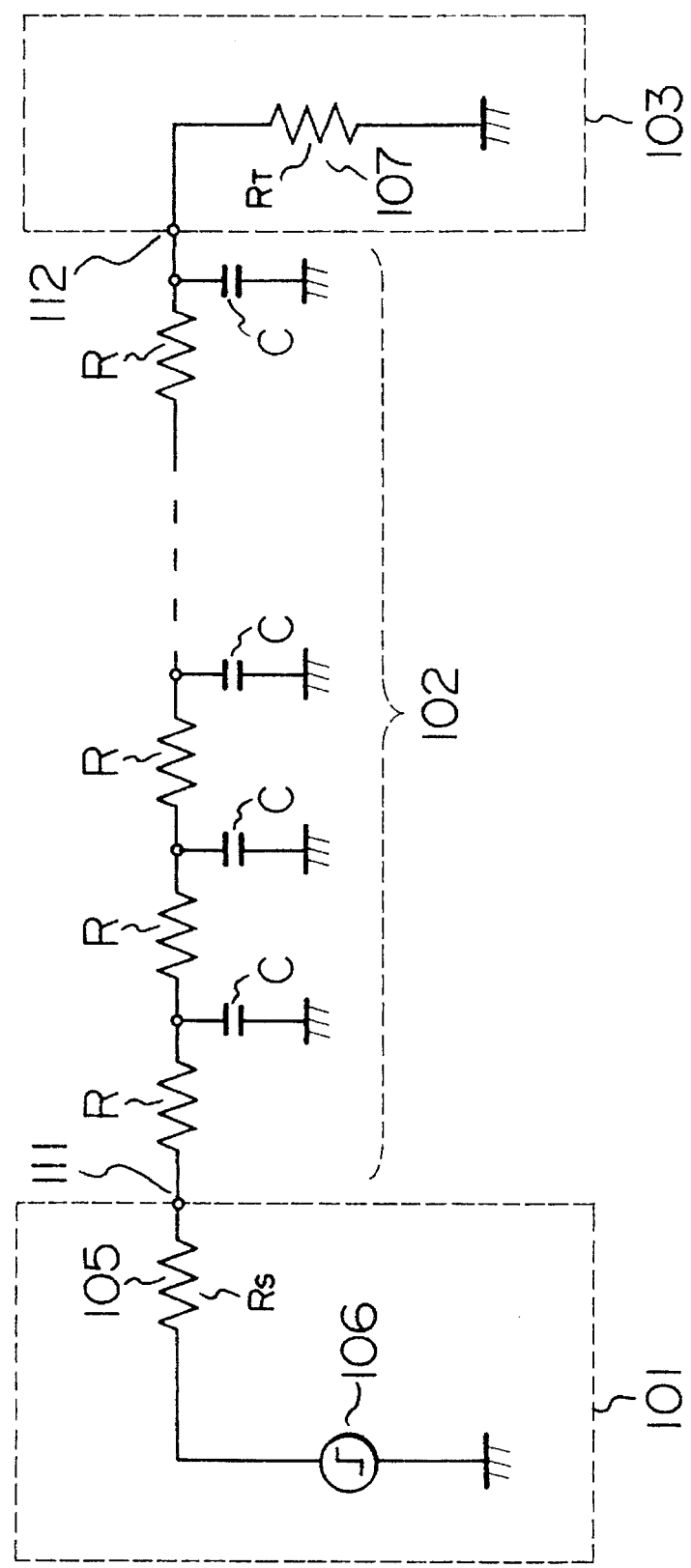
FIG. 2 schematically indicates an equivalent circuit diagram of a major portion of the semiconductor integrated circuit device shown in FIGS. 1A and 1B.

As represented in FIG. 1B, the current sense circuit 103 is constructed of a terminal resistor 107 for terminating the line terminal 112, and a circuit 108 for sensing a current flowing through this terminal resistor 107 to convert this current into a voltage signal which will then be outputted to an output terminal 109. Here, resistance values of the output resistor 105 and the terminal resistor 107 of the voltage driving are set to be smaller than a total resistance value of the signal wiring 102. In this signal transfer system, when the voltage driver circuit 101 is driven by the voltage signal, such a signal current obtained by dividing the amplitude of the voltage signal by a summation among the output resistor 105, the total wiring resistance of the signal wiring 102, and the terminal resistor 107, may flow through this terminal resistor 107. This current is sensed by the voltage receiver circuit 103 to be converted into a voltage, so that the signal transfer is carried out. An equivalent circuit of this signal transfer system is indicated in FIG. 2. The signal wiring 102 must be handled as a distributed constant signal line constructed of a resistor and a capacitor. It should be noted that symbol "R" indicates line resistance per unit length of the signal line and symbol "C" shows line capacitance per unit length of this signal line.

In FIG. 1B, there is also shown another case that the signal receiver circuit 10e and the signal wiring 1012 are connected to the signal wiring 102 in such a manner that these signal receiver circuit 10e and signal wiring 1012 are branched from a half way of the signal wiring 102. Since the signal wiring 1012 is also a short distance wiring similar to the signal wiring 1011 (FIG. 1A), the signal receiving circuit 10e is constructed of the normal ECL with the open ended terminal.

A simple explanation will now be made as to current sensing, or voltage sensing. In accordance with the present invention, the line terminal of the long distance wiring is terminated by the resistive element, and the current flowing through this resistive element is sensed. On the other hand, substantially no current will flow from the signal transfer side to the signal receiver circuit and vice versa in such an open-ended terminal type transmission scheme as shown in FIG. 12. Precisely speaking, since a signal is received by a base electrode of a bipolar transistor in an ECL gate circuit, a very small current will flow. However, as the value of this current is smaller than the current of the ECL gate circuit by about two digits, it may be considered that no current flows. Also, no current will flow in a CMOS circuit under the normal condition. As a result, the signal is sensed by way of the voltage at the line terminal, and the input resistance is very high. Conversely, in the transmission scheme in which the terminal is shortened, since electrons are quickly charged and discharged, the amplitude of the voltage appearing at the line terminal is permissibly made as small as possible, and the variation in the currents at the receiving end is sensed, so that this sensed variation is converted into a large variation in the voltages. As a consequence, the input resistance at the line terminal is normally small. In accordance with the present invention, it is an important factor to consider the magnitude relationship between the line resistance and the input resistance of the circuit of this shortened terminal.

As to the driver circuit, the voltage driver circuit is to output a constant amplitude of a voltage, and since a change in voltages caused by a variation in the output currents are small, the output resistance generally becomes small. However, when the output current is increased, the amplitude of the voltage is lowered due to the finite output resistance. On the other hand, the current driver circuit is to output a constant amplitude of a current, and since a variation in currents caused by a change in an output voltage becomes small, generally speaking, the output resistance is large. Accordingly, a difference between them is caused by the differences in the output resistors, which is the best way to easily understand. Therefore, in accordance with the present invention, the voltage driver circuit may be defined as such a driver circuit that the output resistance becomes lower than the line resistance, which constitutes the basic condition of the present invention, as described above.

Next, a description will now be made of the current waveform appearing at the line terminal in the transfer system for the long distance wiring according to the present invention, as shown FIG. 2.

Figure 3A:
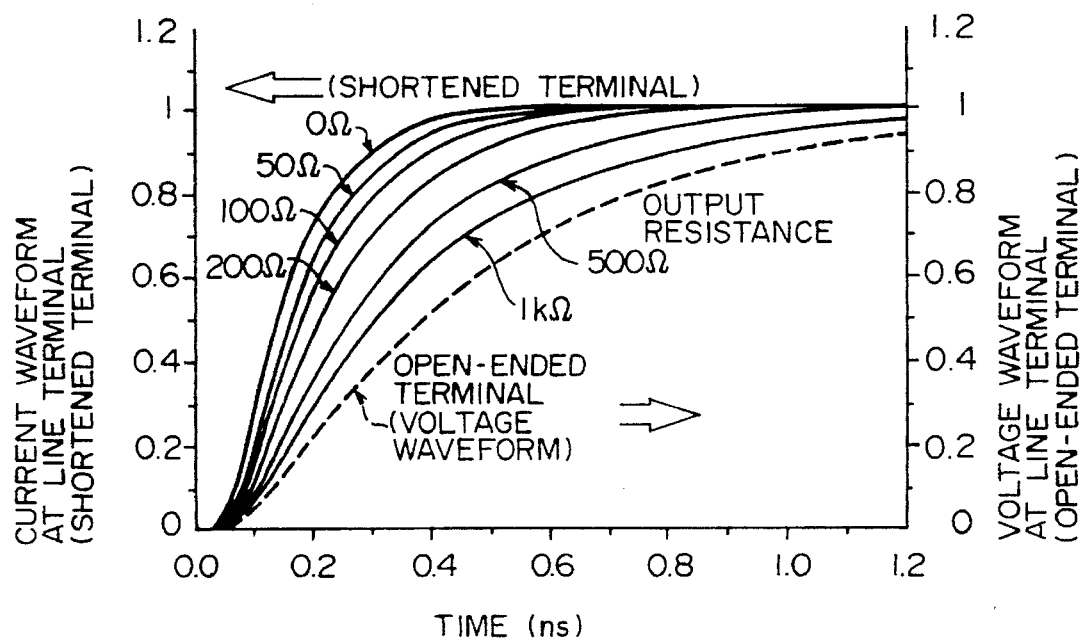
FIG. 3A is a graphic representation for showing variations in output resistances of the driver circuit positioned at the source terminal and in current waveforms at the line terminal in the wiring of the semiconductor integrated circuit device shown in FIG. 1A and FIG. 1B.

FIG. 3A graphically represents waveforms appearing at the line terminal under such circumstances that the output resistance Rs of the driver circuit is used as the parameter, the line terminal 112 is ideally shortcircuited (terminating resistor Rt=zero ohm), and the waveform of the input pulse of the driving voltage source 101 is selected to be a stepped pulse. In this graphic representation, the waveform appearing at the signal receiving end when the receiving end is open is compared with the waveform of the current appearing at the signal receiving end in case that the line resistance "R" per unit length is 53.6 ohms/mm, the line capacitance "C" per unit length is 0.19 PF/mm, and the wiring length "L" is 10 mm. As easily understood from the graphic representation, the rising time of the waveform at the line terminal becomes fast, as compared with that in the open-ended terminal type transmission scheme, in the shortened terminal type transmission scheme, when the output resistance Rs of the driver circuit is lowered. In particular, there is a greater effect when the output resistance Rs is lower than approximately the total line resistance (=R·L) of the wiring. It is assumed that the wiring length is "L". On the other hand, since the output resistance Rs is very large due to the current source driving mode, this effect cannot be achieved in the above-described conventional terminated line terminal type transfer system.

Figure 3B:
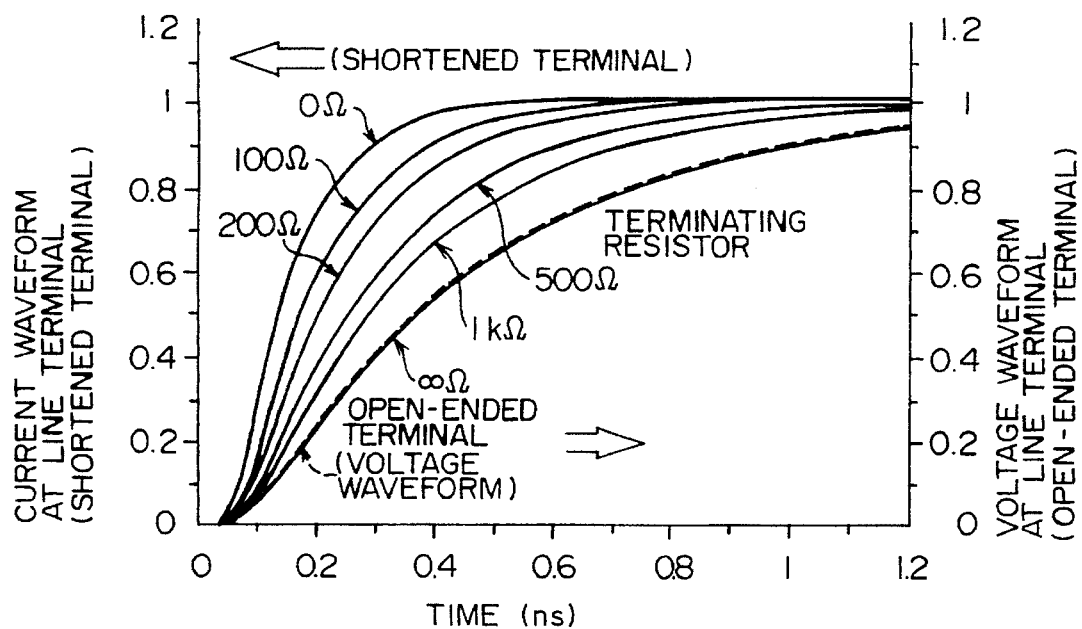
FIG. 3B is a graphic representation for indicating variations in current waveforms caused by the terminal resistance at the line terminal in the wiring of the semiconductor integrated circuit device shown in FIG. 1A and FIG. 1B.
Figure 18:
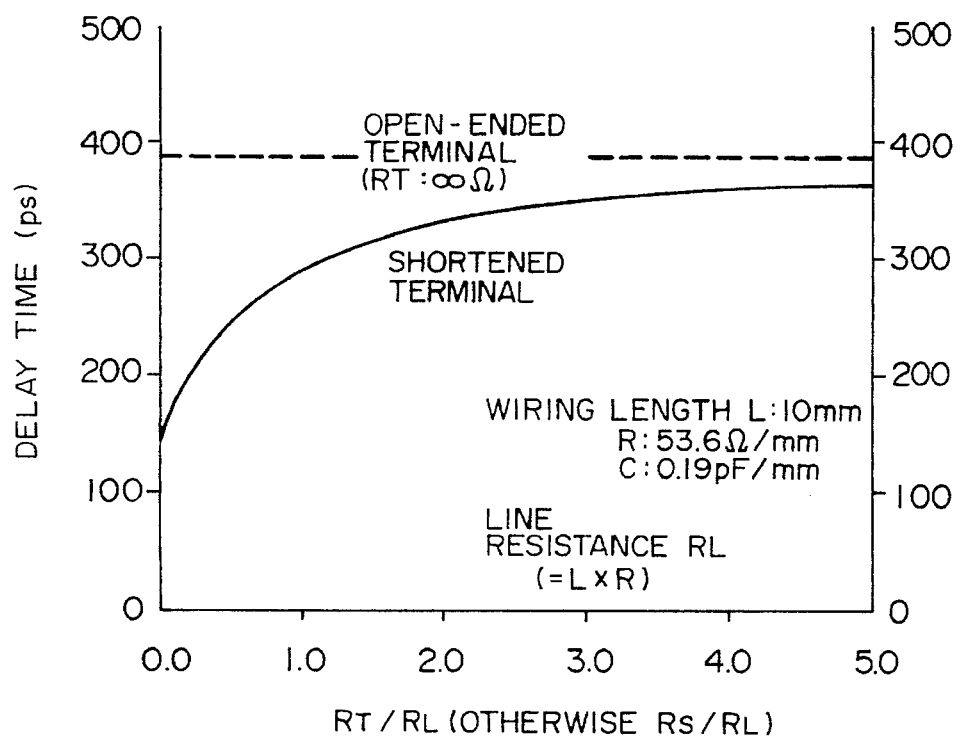
FIG. 18 graphically shows a relationship between delay time in a signal transfer and a ratio of the line resistance to the input resistance of the current sense circuit employed in the semiconductor integrated circuit device of FIG. 1A and FIG. 1B.

FIG. 3B graphically shows waveforms appearing at the line terminal in a transmission scheme similar to that of FIG. 3A under such conditions that the terminal resistance "Rt" of the receiver circuit is used as the parameter, the output resistance "Rs" of the driver circuit is ideally set to zero ohm, and the waveform of the input pulse for the driving voltage source 101 is a stepped pulse. Also in this case, the smaller the terminating resistor Rt of the receiver circuit becomes, the faster the rising time of the waveform at the line terminal becomes in the shortened terminal type transmission scheme, as compared with the open-ended terminal type transmission scheme. It should be noted that FIG. 18 represents the high-speed effect according to the present invention, assuming that a ratio of the total line resistance RL to either the terminating resistor Rt, or the output resistance Rs is indicated in an abscissa of this drawing, and delay time is denoted in an ordinate thereof. It may be understood that when either the output resistance "Rs", or the terminal resistance "Rt" becomes lower than about the total line resistance (=R×L) of the wirings, more effective results can be obtained.

Figure 20:
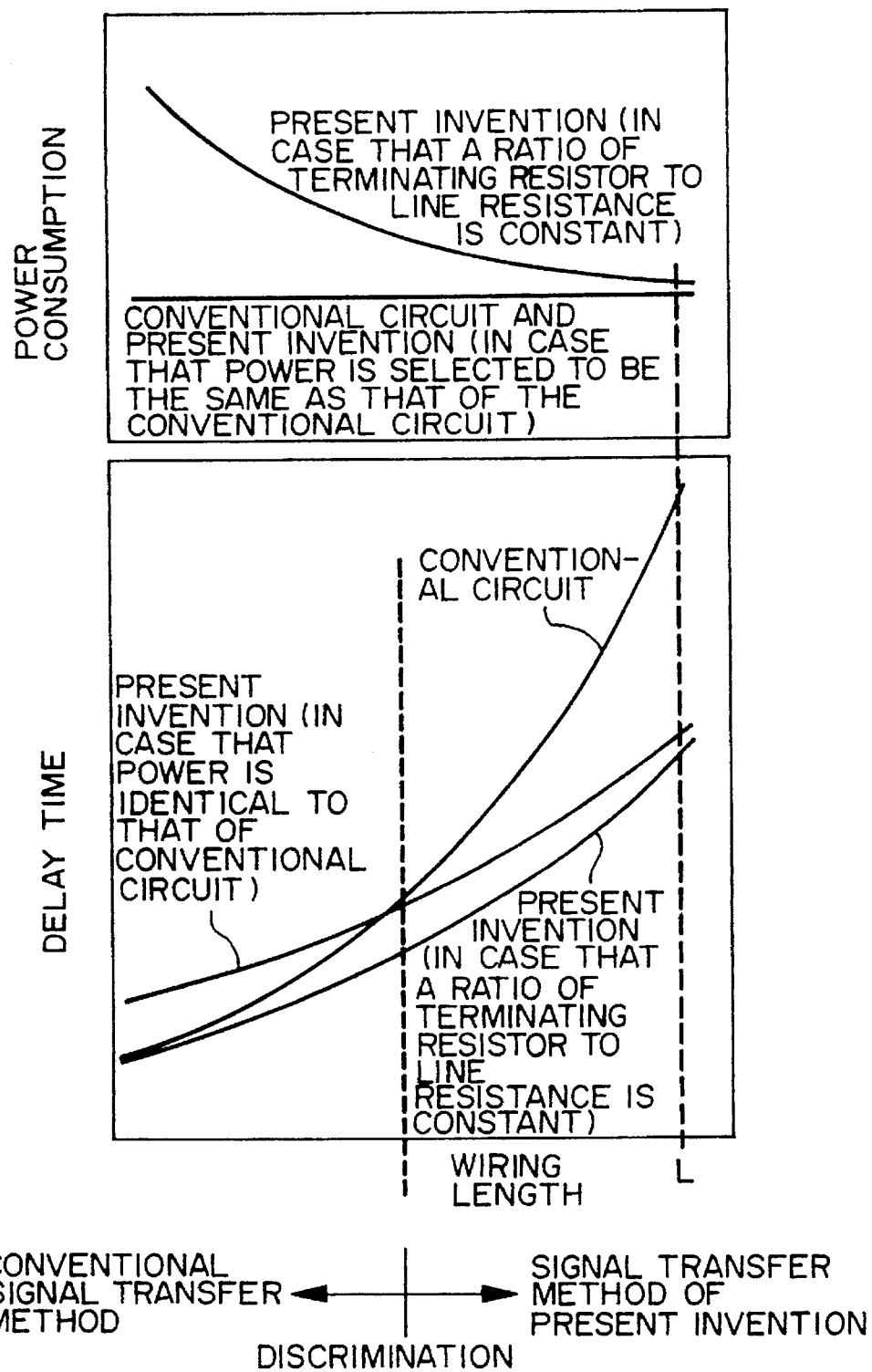
FIG. 20 is a schematic illustration for explaining how to separately utilize the current sense circuit and the voltage sense circuit according to the present invention.

FIG. 20 explanatorily shows how to utilize as a proper transmission scheme, the transmission schemes according to the embodiment of the present invention, as shown in FIG. 19A, FIG. 19B, FIG. 1A and FIG. 1B, in view of effects in power consumption and high-speed. An abscissa of this graphic representation of FIG. 20 indicates the wiring length, whereas an ordinate thereof denotes the delay time and the power consumption. When the power consumption is made constant and the wiring length is increased in the conventional circuit, it nearly becomes a square characteristic, so that the delay time is rapidly increased. On the other hand, in accordance with the present invention, it is so designed that the terminating resistor is equal to the line resistance at the terminated line terminal, and the power consumption under condition of the wiring length "L" is the same as that of the conventional circuit. Consider such a case that this wiring length "L" is gradually made short. Assuming now that the ratio of the terminal resistance to the line resistance is kept constant (for instance, a ratio of 1:2), since the current flowing from the driver circuit into the line terminal is gradually increased, the power consumption is decreased. However, since the ratio of the delay time (especially, wiring delay) to the high-speed treatment is substantially maintained, the signal transfer speed is always faster than that of the conventional circuit. On the other hand, when the wiring length is shortened from the above-described length "L" while the power consumption is kept constant, since the line resistance is gradually lowered, the terminating resistor must be increased, so that the highspeed effect would be deteriorated as compared with that of FIG. 18. Actually, since there are provided the circuit and the like for converting the current into the voltage, such a wiring length may exist which is delayed, as compared with that of the conventional circuit. This wiring length may constitute a boundary used to determine whether the signal transfer method according to the present invention, or the conventional signal transfer method according to the present invention, or the conventional signal transfer method may be utilized. The long distance wiring and the short distance wiring shown in FIG. 19A and FIG. 19B correspond to those indicated in FIG. 1A and FIG. 1B. The wiring 102 represents a relatively long wiring. A voltage drive circuit 101 and a current sense circuit 103 are used for signal transmission along this long wiring 102 between the logic circuits 10c and 10d. The output resistance of the voltage drive circuit 101 and the input resistance of the current sense circuit 103 are designed to be smaller than the DC resistance of the long wiring 102 between an end thereof connected to the voltage drive circuit 101 and another end of the long wiring 102 connected to the current sense circuit 103. The wiring 1011 represents a relatively short wiring. A voltage drive circuit 101a is used but no current sense circuit is used for signal transmission along this short wiring 1011 between logic circuits 10a and 10b. The wiring 1012 represents another relatively short wiring which is connected to the relatively long wiring 102. The short wiring 1012 shares the voltage drive circuit 101 with the wiring 102, but no current sense circuit is used for the short wiring 1012 for signal transmission between logic circuits 10c and 10e. The following presumption applies to this short wiring 1012. A sum of DC resistance of the short wiring 1012 and DC resistance of a portion of the long wiring 102 which is located between an output point of the voltage driver 101 and a connecting point at which the short wiring 1012 is connected to the long wiring 102 is smaller than the DC resistance of the long wiring 102.

Figure 4:
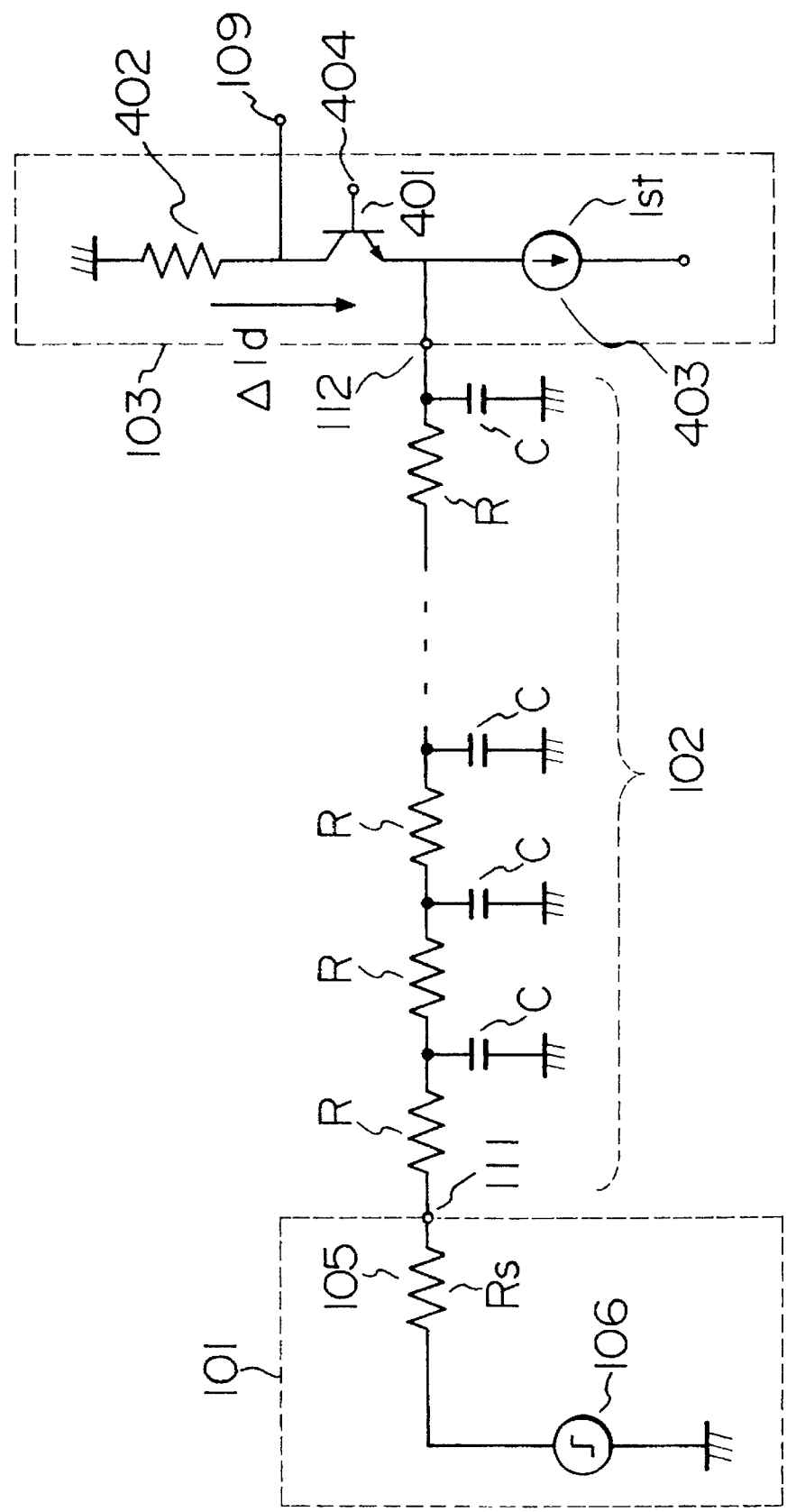
FIG. 4 schematically represents a base grounded circuit used as the current sense circuit of the semiconductor integrated circuit device shown in FIG. 1A and FIG. 1B.

In FIG. 4, there is shown an embodiment of the present invention in which a transistor 401 is employed as the terminal resistor, and the signal receiver circuit 103 is arranged by a base grounded type current/voltage converting circuit. When a bias current "1st" is supplied to this transistor 401 by employing a current source 403 in order that a voltage between the base of the transistor 401 and the emitter thereof becomes higher than about 0.8 V, resistance (input resistance) of the transistor 401 becomes several tens of ohms, as viewed from this emitter. As a consequence, since line resistance per unit length of an aluminum wiring, the wiring width of which is, for instance, several micrometers, and also the wiring thickness of which is, for example, 1 micrometer, becomes several tens of ohms/mm, the resistance (terminating resistor) of the transistor 401 may be made smaller than the total wiring resistance even for the wiring with several millimeters. It should be noted that in order to make this input resistance smaller than the total line resistance, when this input resistance is required to be more decreased, the resistance value of the resistor 402 may be lowered to increase the current 1st. On the other hand, in the signal transfer system according to this embodiment, assuming now that the driver circuit 101 is voltage-driven, a signal current "Δ Id" defined by dividing the voltage amplitude by a summation of the output resistance Rs, the terminating resistor, and the total line resistance may flow through the wiring 102, and this signal current will flow via the transistor 401 of the signal receiver circuit 103 through the resistor 402. In other words, a voltage drop is produced across the resistor 402, which is directly proportional to the signal current "Δ Id", and this voltage drop is derived as the voltage signal from the output terminal 109.

Figure 5:
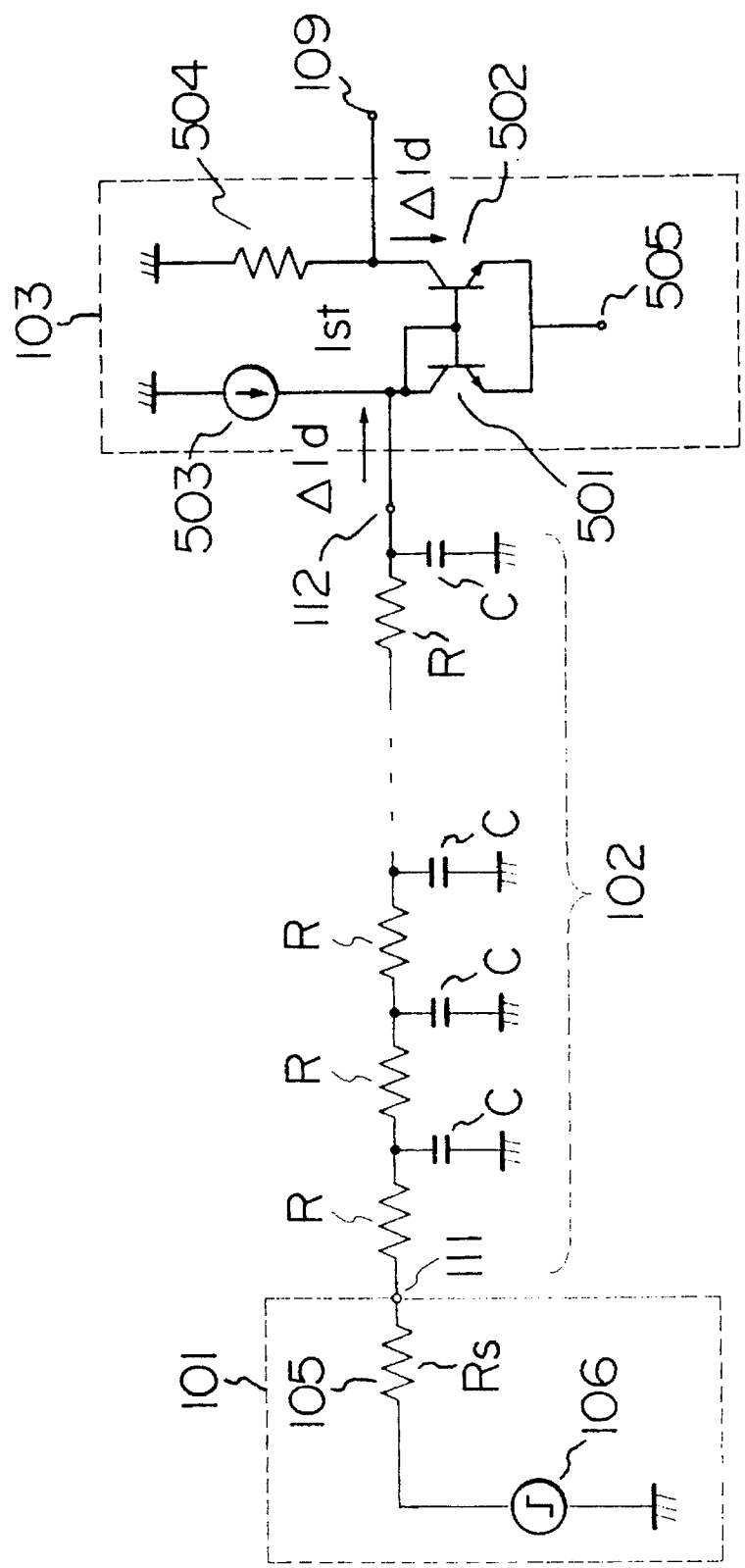
FIG. 5 schematically illustrates a current mirror circuit used as the current sense circuit of the semiconductor integrated circuit device indicated in FIG. 1A and FIG. 1B.

In FIG. 5, there is shown an embodiment of the present invention, in which a transistor 501 is employed as the terminal resistor, and the signal receiver circuit 103 is arranged by a current mirror type current/voltage converting circuit. The transistor 501 is operated as a diode since the base of this transistor is connected to the collector thereof. When a bias current "1st" flows from a current source 503 in such a manner that a voltage between the base of this transistor and the emitter thereof becomes approximately 0.8 V or higher, the resistance of the transistor 501 becomes several tens of ohms. In other words, the terminating resistor (input resistance of circuit 103) of this transfer system is on the order of several tens of ohms, so that the terminating resistor may be made smaller than the total line resistance in a similar manner to that of the above-described embodiment shown in FIG. 4. It should be understood that when this input resistance must be further lowered, for instance, the bias current 1st may be increased. On the other hand, the signal transfer according this embodiment is carried out in such a way that if the driving circuit 101 is voltage-driven, then a signal current "Δ Id" will flow through the wiring 102, which is defined by diving the voltage amplitude by a summation of the output resistor Rs, the terminating resistor, and the total line resistance, and this signal current will flow through the transistor 501 of the signal receiver circuit 103. At this time, since the transistors 501 and 502 constitute the current mirror circuit, a current identical to this signal current "Δ Id" flows through the transistor 502 and the resistor 504, a voltage drop is produced across the resistor 504, which is directly proportional to the above-described signal current "Δ Id", and this voltage drop is derived as the voltage signal from the output terminal 109.

Figure 6:
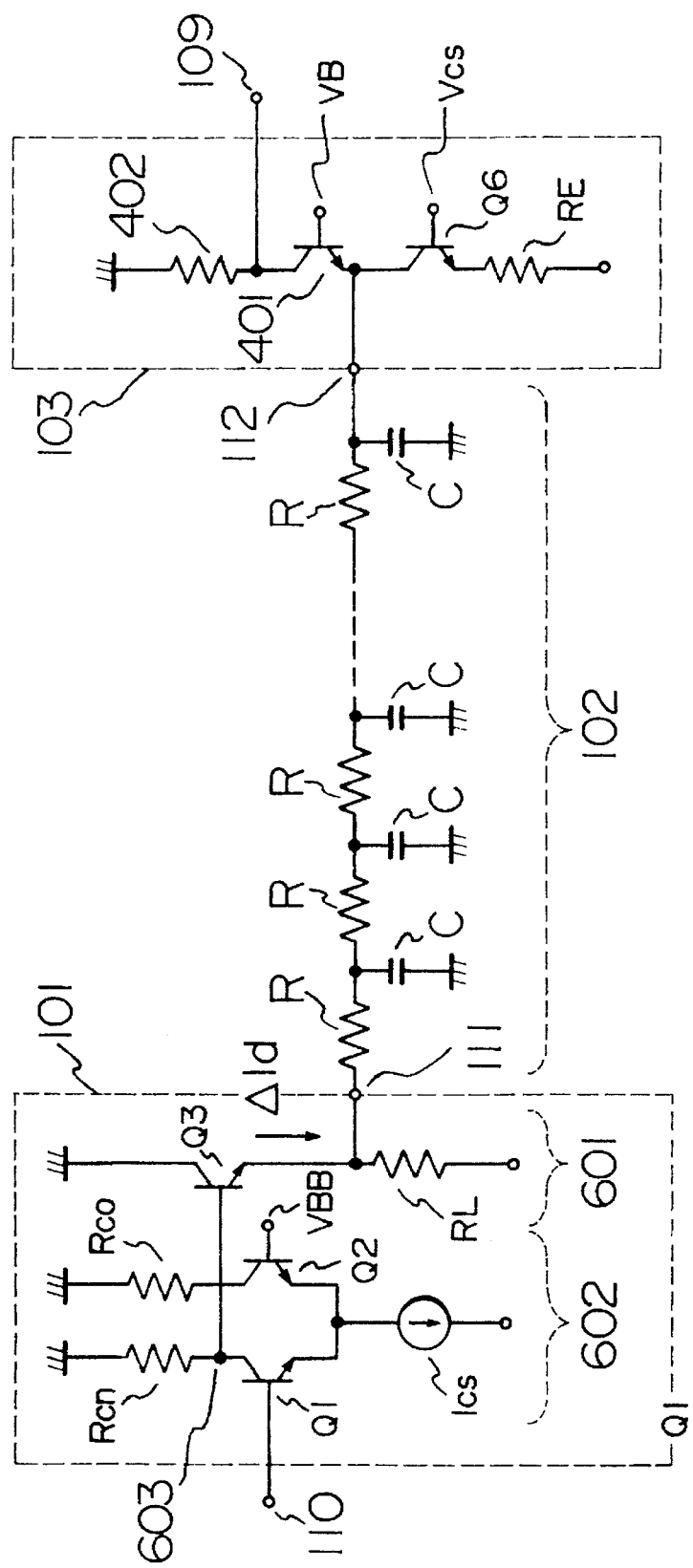
FIG. 6 schematically indicates an emitter coupled type logic circuit used as the driver circuit of the semiconductor integrated circuit device shown in FIG. 1A and FIG. 1B.

In FIG. 6, there is represented an embodiment of the present invention, in which an emitter coupled type logic circuit with an emitter follower circuit is employed as the driver circuit 101. A signal receiver circuit 103 of FIG. 6 corresponds to the signal receiver circuit 103 indicated in the embodiment of FIG. 4, and a current source 403 is constituted by a transistor Q6 and a resistor RE. A driving circuit 101 is constituted by an emitter coupled type logic circuit with an emitter follower circuit and includes an emitter coupled type current switch circuit 602 and an emitter follower circuit 601. In the emitter coupled type current switch circuit 602, a current "Ics" of a constant current source will flow through either a transistor Q1 or Q2, depending upon a difference between the potential at the input 110 and the reference voltage VBB. For instance, when the potential at the input 110 is higher than the reference voltage VBB, the current flows via the transistor Q1 to a resistor Rcn, and thus a voltage drop occurs, so that a circuit point 603 is brought into a low level. Conversely, when the potential at the input is lower than the reference voltage VBB, since the current Ics of the constant current source will flow through the transistor Q2, no current flows through this resistor Rcn, so that the circuit point 603 is brought into a high level. A level difference in this signal becomes a voltage signal, and then the emitter follower circuit 601 voltage-drives the signal transfer line (signal wiring) 102. A signal transfer operation of this embodiment is carried out in a similar manner to that of the embodiment of FIG. 4. At this time, output resistance of the driver circuit 101 is equal to parallel resistance between the resistance, as viewed from the emitter of the transistor Q3, and resistance of a pull-down resistor RL. On the other hand, the transistor Q3 of the emitter follower circuit 601 is biased by the currents flowing through the pull-down resistor RL and the signal wiring 102 in such a manner that a voltage between the base of this transistor Q3 and the emitter thereof is on the order of 0.8 V. As a consequence, the resistance, as viewed from the emitter of the transistor Q3, is lowered to approximately several tens of ohms, and also the output resistance of the driver circuit 101 is on the order of several tens of ohms. Furthermore, to reduce this output resistance, for instance, the resistance of the resistor RL is lowered, thereby increasing the current flowing through the transistor Q3. The emitter resistance of the transistor Q3 becomes small when this current becomes large. It should be noted that the signal receiver circuit shown in the previous embodiment of FIG. 5 may be employed as the signal receiver circuit 103 in this signal transfer system.

Figure 7:
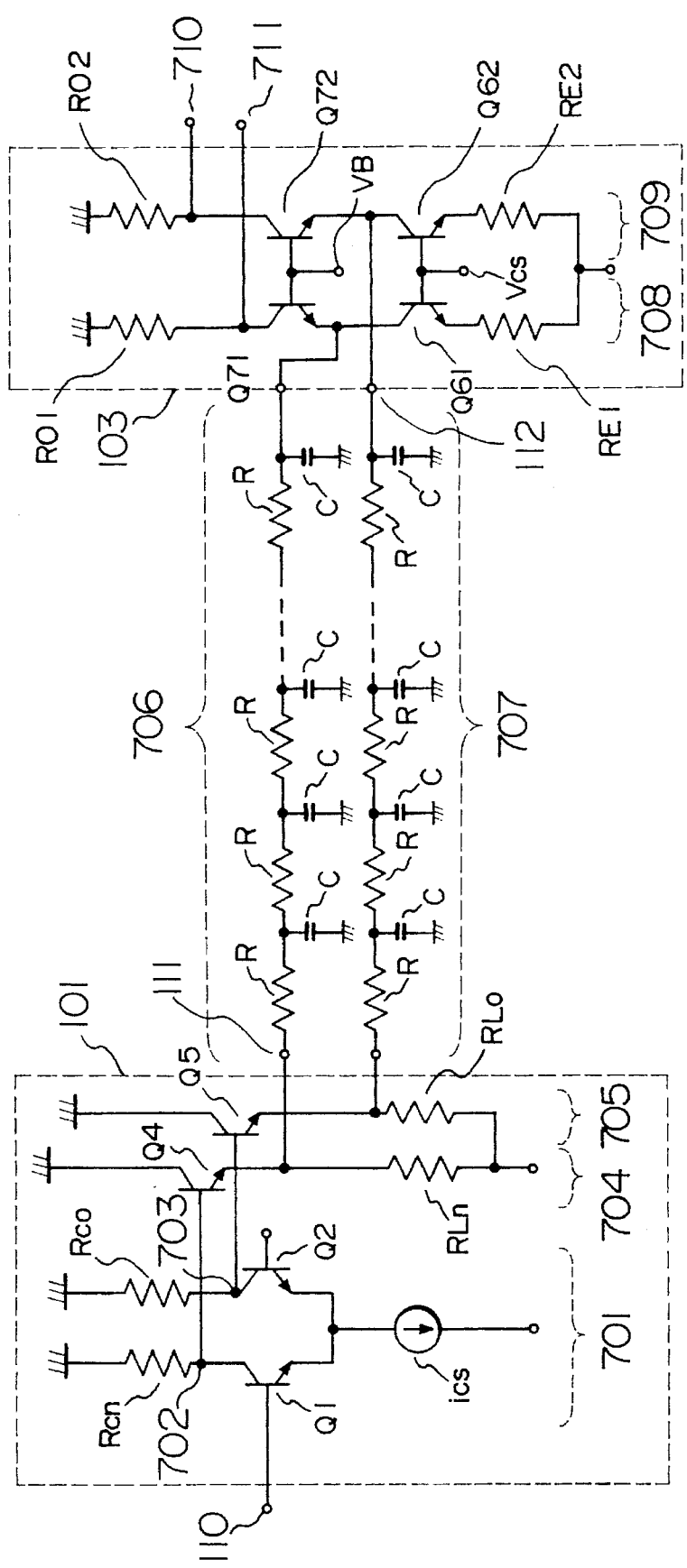
FIG. 7 indicates another semiconductor integrated circuit device employing a differential signal transfer system, according to another embodiment of the present invention.

In FIG. 7, there is shown an embodiment of the present invention, in which the transmission scheme of the embodiment shown in FIG. 6 is replaced by a differential transmission scheme. To design the driver circuit as the differential output, emitter follower circuits 705 and 704 are provided at a positive output 703 and a negative output 702 of an emitter coupled type current switch circuit 701. Two signal systems of signal wirings 707 and 706 are provided for the signal transfer path 102 (in FIGS. 1A and 1B) in order to transfer and receive the differential signal. Also, two signal receiver circuits 708 and 709 are employed to constitute the signal receiving as the signal receiving circuit in the embodiment of FIG. 4 circuit 103 so as to receive the differential signals appearing in the respective signal systems. As complementary voltage signals are outputted to the outputs 703 and 704 of the emitter coupled type current switch circuit 701 of the driver circuit 101, the complementary voltage signals are transferred via the respective transmission schemes to the outputs 710 and 711 of the signal receiver circuit 103. A logic circuit to be connected to the current sense circuit 103 should be one which responds to the pair of complementary voltage signals. Furthermore, in the arrangement of this transmission scheme, the signal receiver circuit shown in the previous embodiment of FIG. 5 may be used as the signal receiver circuit 103.

Figure 8:
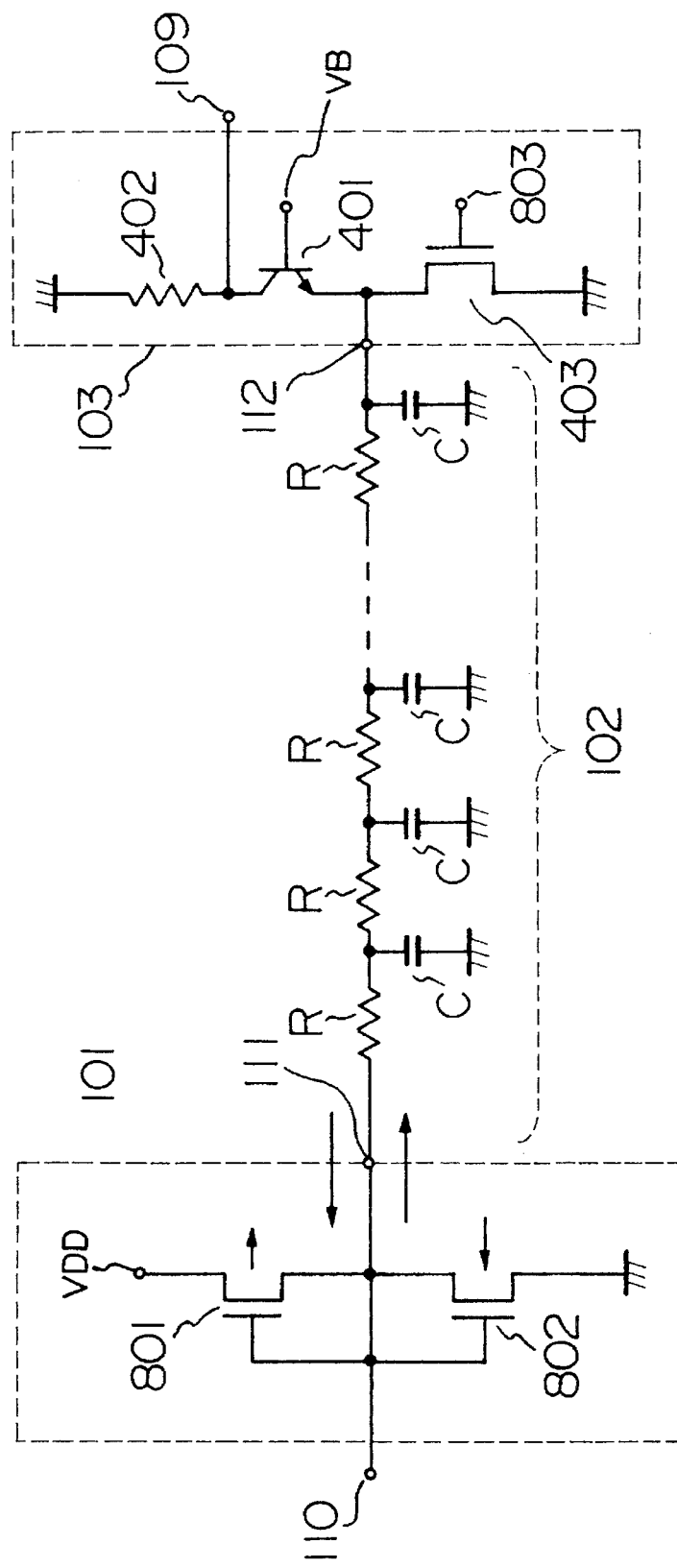
FIG. 8 represents a driver circuit and a current sense circuit, which are arranged by CMOS, used in the semiconductor integrated circuit device shown in FIG. 1A and FIG. 1B.

In FIG. 8, there is indicated another embodiment of the present invention, in which a CMOS is employed in the driving circuit 101. That is, the driver circuit 101 is constructed of a pMOS transistor Q1 and an nMOS transistor Q2. The signal receiver circuit 103 is constructed in a similar manner to that of the embodiment shown in FIG. 4, and owns such a different arrangement. That is, a current source 403 for supplying a bias current through the transistor 403 is constructed of an nMOS transistor whose gate electrode 803 is biased. This transmission scheme is operated as follows: When a level at an input 110 of the driver circuit 101 is a high level, the MOS transistor 802 is turned ON and thus a current Id1 will flow from the signal receiver circuit 103 via the signal wiring 102. Conversely, when the level at this input 110 becomes a low level, the MOS transistor 801 is turned ON, so that a current Idh will flow from the MOS transistor 801 via the signal wiring 102 into the MOS transistor 403 of the signal receiver circuit 103. As a result, a current flowing through the transistor 401 and the resistor 402 is varied by a difference between these currents, and this variation in the currents is represented as a potential difference of the resistor 402, which constitutes a receiving voltage signal. A terminating resistor corresponds to a resistance, as viewed from the emitter of the transistor 401, and is small, i.e., several tens of ohms, similar to that of the preceding embodiment of FIG. 4. Since the output impedance of the driving circuit 101 corresponds to an ON-resistance of the MOS transistor, if the gate width is widened, then this output impedance may be made lower than several hundreds of ohms, which is effective in such a case that the length of the wiring is long and the total line resistance becomes larger than several hundreds ohms. Moreover, in addition, it is so constituted that a flip-flop circuit is connected to the output 109 of this signal receiver circuit 103, and the receiving signal may be continuously held by this flip-flop circuit. Also, power consumption can be saved by performing such a control that the gate potential of the MOS transistor functioning as the current source 403 of the signal receiver circuit 103 is increased only when the driver circuit 101 transmits the signal, and this MOS transistor is turned OFF when the transmission/reception operations are not carried out.

Figure 9:
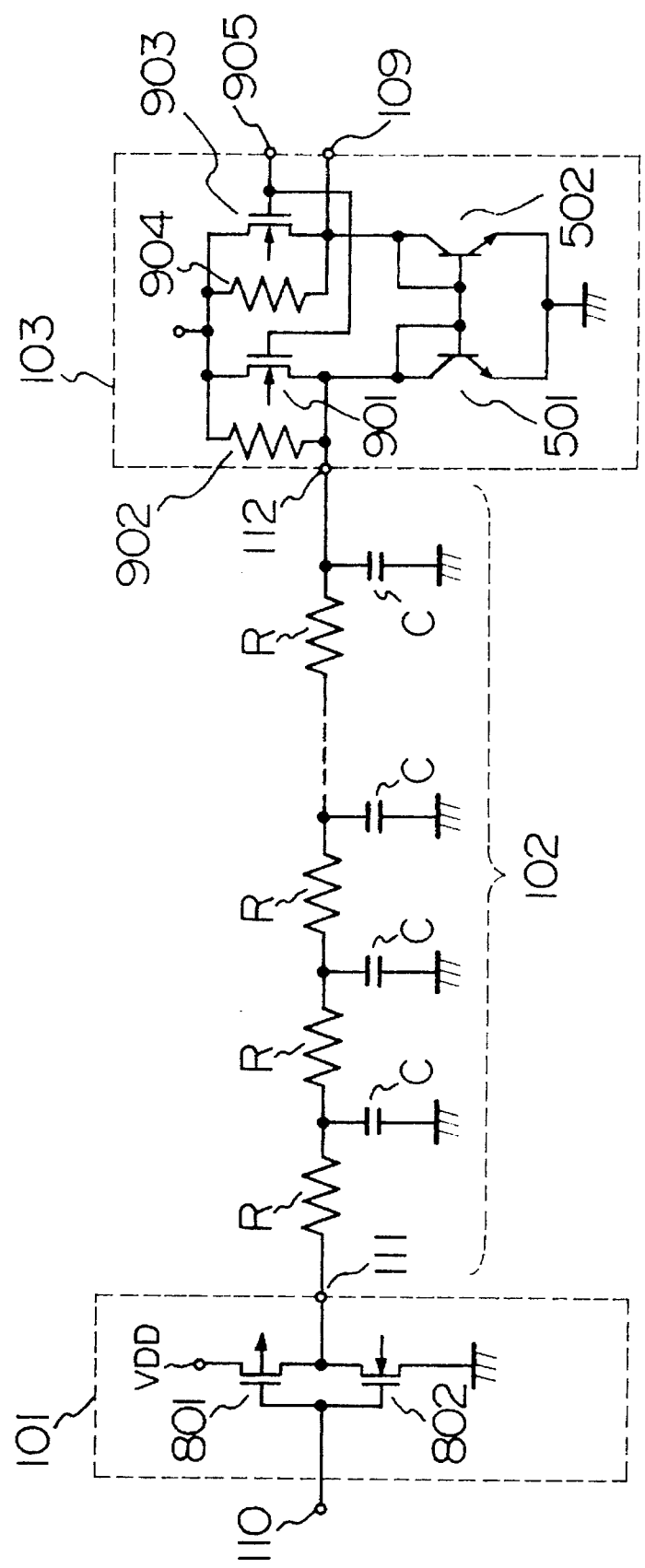
FIG. 9 schematically shows a current sense circuit consisting of an arrangement of bipolar transistors and MOS transistors, used in the semiconductor integrated circuit device indicated in FIG. 1A and FIG. 1B.

FIG. 9 schematically represents an embodiment of the present invention such that the current source 503 employed in the signal receiver circuit 103 of the embodiment shown in FIG. 5 is constituted by MOS transistors. That is, the current source 503 of the signal receiver circuit 103 in the embodiment of FIG. 5 includes an nMOS transistor 901 and a resistor 902 in parallel connection therewith, and the above-described resistor 504 includes an nMOS transistor 903 and a resistor 904 in parallel connection therewith. These resistors 902 and 904 are employed so as to prevent floating conditions of potentials at a line terminal 112 and an output terminal 109. When the gate potentials of the MOS transistors 901 and 903 are increased, these MOS transistors are turned ON and function as a nonlinear resistive element. Similar to this embodiment, when the signal transmission/reception operations are not carried out, these MOS transistors are controlled to be turned OFF, so that power consumption can be saved.

In FIG. 10, there is shown an embodiment of the signal receiver circuit 103 according to the present invention. It is so constituted that the above-explained resistor 402 of the signal receiver circuit 103 employed in the embodiment of FIG. 8 is arranged by a pMOS transistor 1001, and a voltage amplifying circuit 1005 is provided. When a signal current Id will flow, a potential at a connection (junction) point 1006 is lowered. As a result, since the gate potential of the pMOS transistor 1002 is lowered, the current flowing through the pMOS transistor 1022 is increased, so that a potential at the output 109 of the signal receiving circuit 103 is increased. When the potential at the output 109 is increased, the current flowing through the nMOS transistor 1004 is increased, and furthermore the potential at the junction point 106 is lowered, and the potential change at the junction point is amplified. In this case, current supply capability of the nMOS transistor 1004 is set to be lower than that of the pMOS transistor 1002.

Figure 11:
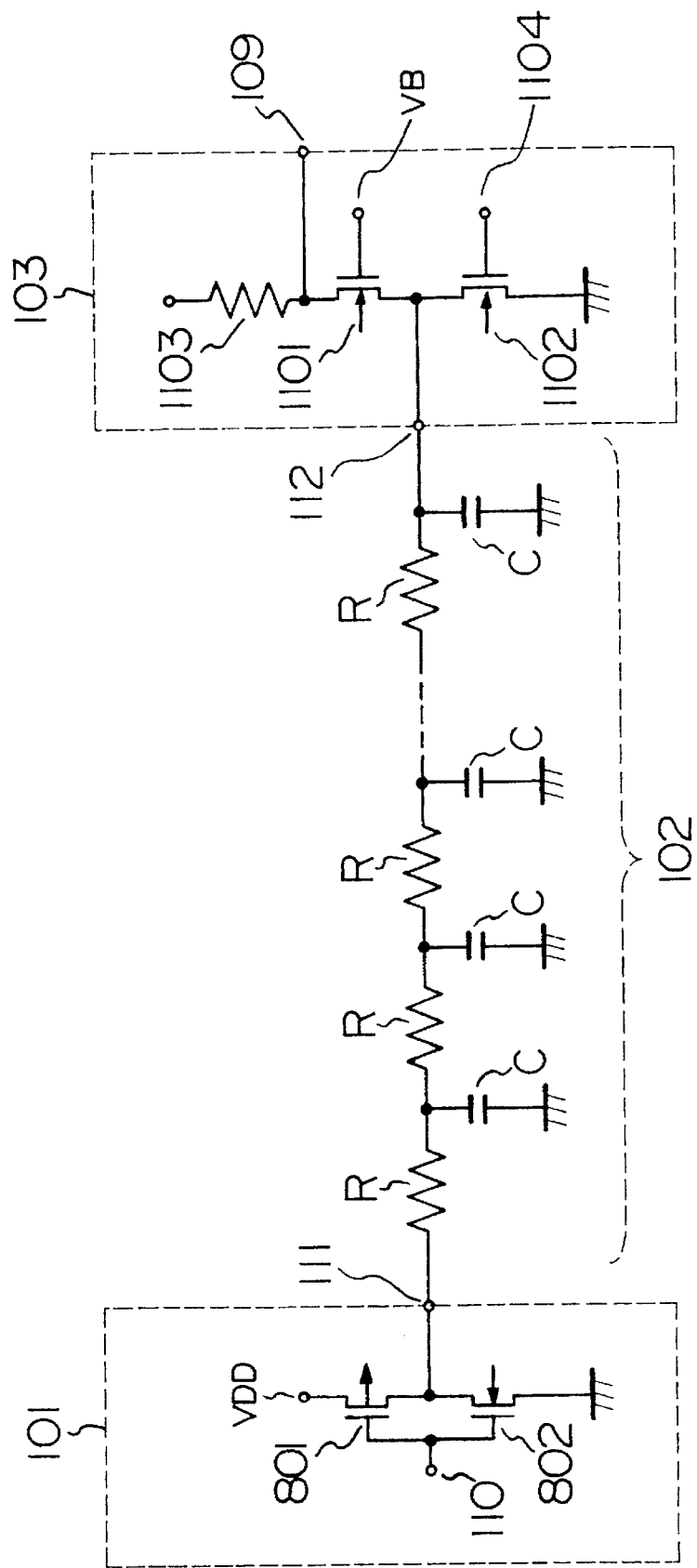
FIG. 11 schematically represents a current sense circuit constituted by MOS transistors, used in the semiconductor integrated circuit device shown in FIG. 1A and FIG. 1.

In FIG. 11, there is shown another embodiment of the present invention, in which MOS transistors are employed as the terminal resistor 107. The signal receiver circuit 103 is arranged by a resistor 1103 from which a voltage signal is derived, an nMOS transistor 1101 functioning as the terminal resistor, and an nMOS transistor 1102 for supplying a bias current to this nMOS transistor 1101. When a constant voltage is applied to the gate 1104 of the nMOS transistor 1101 having the wide gate to flow a bias current in such a manner that a voltage between the gate of the nMOS transistor and the source thereof becomes higher than a threshold voltage of an MOS transistor, resistance as viewed from the source thereof can be selected to be lower than several hundreds of ohms. It should be noted that the bias current supplied to the nMOS transistor 1101 may be set at the gate potential of the nMOS transistor 1102. Further, the resistor 1103 may be replaced by an nMOS transistor having a gate to which a potential is applied.

Figure 15:
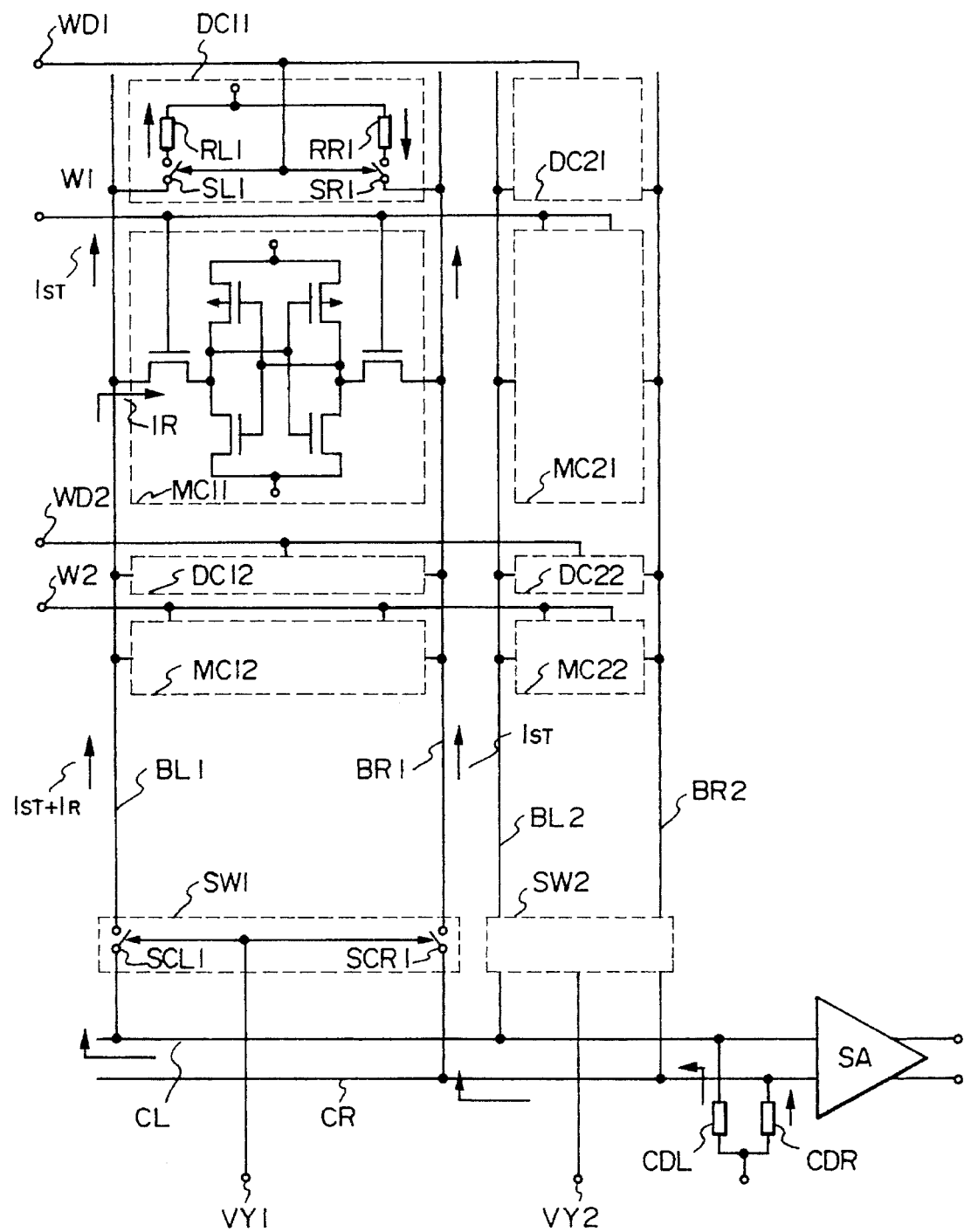
FIG. 15 schematically indicates an example of a memory to which the semiconductor integrated circuit device shown in FIG. 1A and FIG. 1B has been applied.

FIG. 15 schematically indicates an embodiment in which the present invention is applied to a memory. This embodiment is so arranged that a bit line load circuit is provided which is located adjacent to each of memory cells. A bit line load circuit DC11 is constructed of switches SL1 and SR1 which electrically connect either a load RL1, or a load RR1 to the bit lines BL1 and BR1 under control of a selecting line WD1 for the bit line load circuit. Next, a description will be made of operations when a memory cell MC11 is selected to read information stored in the memory cell. When a bit line selecting line VY1 is selected, the switches SCL1 and SCR1 of the bit line selecting switch SW1 are turned ON, so that the bit lines BL1 and BR1 are connected to the common lines CL and CR. Furthermore, when both the word line W1 and the selecting line WD1 for the bit line load circuit are brought into selection conditions, both the memory cell MC11 and the bit line load circuit DC11 are selected.

As a result, a current obtained by summing a read current IR with a bit line stationary current IST will flow through the bit line BL1, the common line CL, and the common line load CDL, whereas the bit line stationary current IST will flow through the bit line BR1, the common line CR, and the common line load CDR. A potential difference is produced at an input of a sense amplifier due to this current difference and the common line load. This potential difference is amplified by the sense amplifier SA, and then the information stored in the memory cell MC11 is read out. It should be understood that the bit line stationary current IST is determined by the resistors RL1 and RR1 of the bit line load circuit, the line resistances of the bit lines BL1, BRL, and the line resistances of the common lines CL, CR, and, furthermore, a load resistor of the common line. In this read operation, the memory cell MC11 functions as the driver circuit, and the loads CDR and CDL of the common lines CR and CL function as terminal resistors, and further the bit line load circuit DC11 functions as the output resistance of the memory cell MC11, so that the effect of the present invention can be achieved. In other words, the shorter the delay time caused by the line resistance being shortened, the smaller both the resistance of the resistor of the above-explained bit line load circuit and the resistance of the common line load are made smaller than the wiring resistances of the bit line and the common line.

Figure 16:
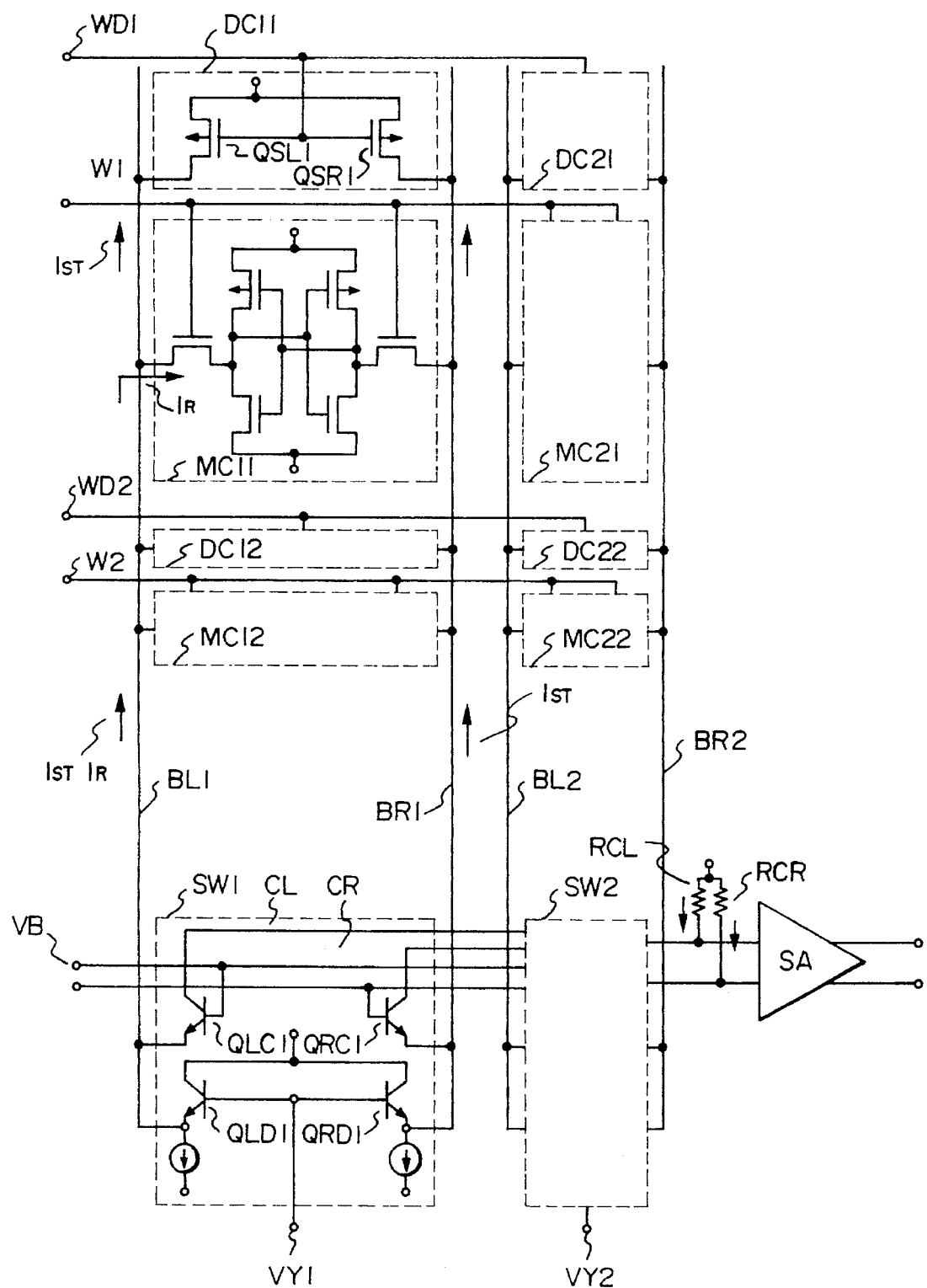
FIG. 16 schematically shows another example of a memory to which the semiconductor integrated circuit device of FIG. 1A and FIG. 1B has been applied.

In FIG. 16, there is shown another embodiment in which the present invention is applied to a memory. In this embodiment, a switch and a load of a bit line load circuit are arranged by transistors QSL1 and QSR1, and a bit line selecting switch SW1 is constructed of a bipolar transistor. An operation of this memory is substantially same as that of the embodiment shown in FIG. 15, but has the following different point. That is, when the potential at the bit selecting line VY1 is higher than a certain fixed potential VB, either a current (IST+IR), or a current (IST) which flow through the bit lines BL1 and BR1 will flow through the transistors QLC1 and QRC1, and the bit lines BL1 and BR1 are not connected to the common lines CL and CR. On the other hand, when the potential at the bit selecting line VY1 is lower than a certain fixed potential VB, namely when the bit lines BL1 and BR1 are selected, the above-described current will flow from the common line load resistances RCL, RCR via the common lines CL, CR and the transistors QLC1, QRC1 into the bit lines BL1 and BR1. As a result, voltage drops are produced at the common line load resistances RCL and RCR, a potential difference is produced at the input of the sense amplifier SA, and then this potential difference is amplified by the sense amplifier SA, whereby the information stored in the memory cell MC11 is read. In this circuit, the memory cell MC11 functions as the driver circuit, and the transistors QLC1 and QRC1 function as the terminal resistance. Also, the resistances of the loads QSL1 and QSR1 of the bit line circuit function as the output resistance of the driver circuit. As a consequence, the smaller the resistances of the transistors QSL1 and QSR1 corresponding to the resistance of the above-explained bit line load circuit, and also the resistances of the transistors QLC1 and QRC1 of the bit line selecting circuit SW1 are made smaller than the line resistance of the bit line, the shorter the delay time caused by the line resistance of the bit line can be reduced. It should be noted that the resistances of the transistors QLC1 and QRC1 may be reduced by the currents IBL1 and IBR1 which constantly flow when the bit line is selected.

Figure 17:
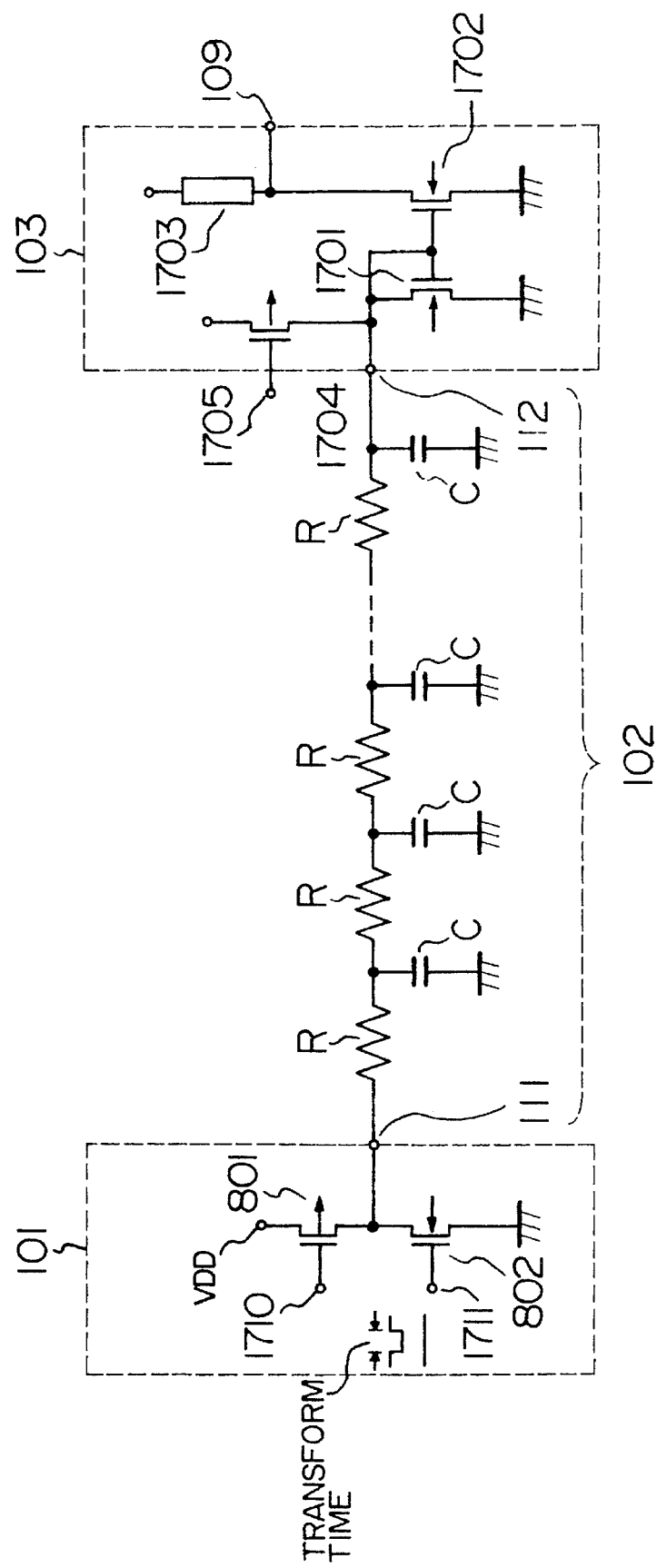
FIG. 17 schematically indicates another embodiment of the present invention, in which the semiconductor integrated circuit device shown in FIG. 1A

FIG. 17 represents another embodiment in which the arrangement of the embodiment of FIG. 5 is constructed of MOS transistors. That is, the driver circuit 101 is arranged by CMOS, and the signal receiver circuit 103 is arranged by a current mirror circuit constituted by MOS transistors 1701 and 1702. The output unit of the driver circuit 101 is arranged by transistors 801 and 802. Only when data is transferred, signals are supplied to gate terminals 1710 and 1711 in order to turn ON either the transistor 801, or the transistor 802. For example, when a high-level signal is transferred, if a low-level (ground level) signal is supplied to a gate terminal 1710 and a low-level (ground level) signal is supplied to another gate terminal 1711, then the transistor 801 is turned ON so that a current will flow via the wiring 102 into the transistor 1701 of the signal receiver circuit 103, resulting in a variation of the current flowing through this transistor 1701. As a result, this current change is similarly produced in another transistor 1702 which constitutes the current mirror circuit, and then a voltage change is produced between both ends of the load 1703, whereby the signal transfer operation is carried out. On the other hand, in the normal case, namely during no data transfer time, when a high-level (i.e., voltage level of power supply terminal VDD) signal is supplied to the gate terminal 1710, and a low-level (ground level) signal is supplied to the gate terminal 1711, the output of the driver circuit 101 is brought into the high resistance condition, and no power consumption is made in this portion. The resistance of the transistor 1704 is lowered by supplying the bias current by the transistor 1701. As a result, the output resistance of the driver circuit may be lowered by widening the gate widths of the transistors 801 and 802 of the driver circuit 101. When the bias current is increased by changing the gate potential of the transistor 1704, the resistance of the transistor functioning as the terminating resistor can be reduced. In any of the above-explained embodiments according to the present invention, the current sensing transfer system can be realized in the voltage driving manner, and both the output resistance of the driver circuit and the terminating resistor can be reduced.

As previously described in detail, in accordance with the present invention, it is possible to obtain such a semiconductor integrated circuit device that to sense the waveform of the current flowing through the terminal resistor in the terminated signal receiving type signal transfer system, the rising time is several times higher than that of the waveform of the voltage appearing at the signal receiving end when the line terminal is open. As a consequence, delays in the signal transfer operation caused in the wiring can be reduced.

What is claimed is:

1. A semiconductor integrated circuit device, comprising:
   a substrate comprised of semiconductor;
   a plurality of logic circuits provided on said semiconductor substrate, said plurality of logic circuits being subdivided into a plurality of blocks;
   at least one first inter-block wiring, formed on said semiconductor substrate, and transferring a signal between first and second blocks located relatively near to each other among said plurality of blocks;
   at least one second inter-block wiring having a length considerably longer than that of said at least one first inter-block wiring, formed on said semiconductor substrate, and transferring a signal between third and fourth blocks located relatively far away from each other among said plurality of blocks;
   a first driver circuit connected to a first end of said first inter-block wiring and to a first logic circuit included in said first block and applying to the first end of said first inter-block wiring a voltage signal corresponding to a voltage signal outputted by said first logic circuit;
   a second driver circuit connected to a first end of said second inter-block wiring and to a third logic circuit included in said third block, and transferring to a second end of said second inter-block wiring a voltage signal corresponding to a voltage output provided by said third logic circuit, said second driver circuit having an output resistance smaller than a DC resistance between the first end of said second inter-block wiring and said second end thereof;
   a current sense circuit connected to the second end of said second inter-block wiring and outputting a voltage signal, corresponding to a current signal flowing into said current sense circuit through said second end of the second inter-block wiring, in response to said current signal, said current sense circuit having an input resistance smaller than said DC resistance;
   a second logic circuit included in said second block and connected to a second end of said first inter-block wiring in said second block, said second logic circuit receiving, as an input, a voltage signal appearing at the second end of said first inter-block wiring; and
   a fourth logic circuit included in said fourth block and connected to said current sense circuit, said fourth logic circuit receiving, as an input, said voltage signal outputted by said current sense circuit.

2. A semiconductor integrated circuit device, comprising:
   a substrate comprised of semiconductor;
   a plurality of logic circuits formed on said semiconductor substrate;
   at least one first wiring formed on said semiconductor substrate, and transferring a signal between first and second logic circuits included in said plurality of logic circuits;
   at least one second wiring formed on said semiconductor substrate, and transferring a signal between said first logic circuit and a third logic circuit included in said plurality of logic circuits;
   a driver circuit connected to a first end of said first wiring and applying thereto a voltage signal corresponding to a voltage signal outputted by said first logic circuit; and
   a current sense circuit connected to a second end of said first wiring, and outputting a voltage signal corresponding to a current signal flowing into said current sense circuit through the second end of said first wiring, in response to said current signal,
   wherein said driver circuit has an output resistance smaller than a first DC resistance between the first end of said first wiring and said second end thereof,
   wherein said current sensing circuit has an input resistance smaller than said first DC resistance,
   wherein said second logic circuit is connected to said current sense circuit and receives, as an input, said voltage signal outputted by said current sense circuit,
   wherein said second wiring has a first end connected to said first wiring at a point located between the first end of the first wiring and said second end thereof,
   wherein a sum of second DC resistance of a portion of said first wiring between said one end thereof and said point and a third DC resistance of said second wiring between said first end thereof and a second end thereof is smaller than said first DC resistance of said first wiring, and
   wherein said third logic circuit is connected to the second end of said second wiring and receives, as an input, a voltage signal appearing at the second end of said second wiring.

3. A semiconductor integrated circuit device, comprising:
   a substrate comprised of semiconductor;
   a plurality of logic circuits provided on said semiconductor substrate;
   at least a first wiring, formed on said semiconductor substrate, and transferring a signal between first and second logic circuits included in said plurality of logic circuits;
   at least a second wiring having a length considerably longer than that of said at least one first wiring, formed on said semiconductor substrate, and transferring a signal between third and fourth logic circuits included in said plurality of logic circuits;
   a first driver circuit connected to said first logic circuit and to a first end of said first wiring, and applying to the first end of said first wiring, a voltage signal corresponding to a voltage signal outputted by said first logic circuit;

a second driver circuit connected to said third logic circuit and to a first end of said second wiring, and transferring a voltage signal corresponding to a voltage output of said third logic circuit to the first end of said second wiring, said second driver circuit having an output resistance smaller than a DC resistance between the first end of said second wiring and a second end thereof; and a current sense circuit connected to the second end of said second wiring, and outputting a voltage signal corresponding to a current signal flowing into said current sense circuit from said second wiring, in response to said current signal, said current sense circuit having an input resistance smaller than said DC resistance, wherein said second logic circuit is connected to a second end of said first wiring and receives, as an input, a voltage signal appearing at the second end of said first wiring, and wherein said fourth logic circuit is connected to said current sense circuit and receives, as an input, said voltage signal outputted by said current sense circuit.

4. A semiconductor integrated circuit device according to claim 3, wherein said current sense circuit includes:

a transistor having a base connected to a substantially constant voltage source, an emitter connected to the second end of said second wiring, and a collector providing a voltage signal to said fourth logic circuit;

a resistive element provided between said collector and a first voltage source; and a current source connected to said emitter and a second voltage source, and supplying a bias current to said transistor.

5. A semiconductor integrated circuit device according to claim 3, wherein said current sense circuit includes:

a first transistor having a base and collector mutually connected to the second end of said second wiring, and an emitter connected to a first voltage source;

a second transistor having a base connected to both said base and said collector of said first transistor, an emitter connected to said first voltage source, and a collector providing a voltage signal to said fourth logic circuit;

a current source provided between said collector of said first transistor and a second voltage source; and a resistive element provided between said collector of said second transistor and said second voltage source.

6. A semiconductor integrated circuit device according to claim 3, wherein:

said second wiring comprises at least one pair of wirings formed on said semiconductor substrate;

said second driver circuit comprises a complementary type driver circuit having one pair of output terminals connected to first ends of said pair of wirings, and outputting to said one pair of output terminals, one pair of complementary voltage signals corresponding to a voltage signal outputted by said third logic circuit;

said current sense circuit comprises a complementary type current sense circuit having one pair of input terminals connected to second ends of said one pair of wirings, outputting one pair of complementary voltage signals in correspondence with a difference between one pair of current signals which flow into said one pair of input terminals;

said fourth logic circuit is connected to said complementary type current sense circuit and receives, as an input, said one pair of voltage signals supplied from said complementary type current sense circuit and responds to a difference between said one pair of voltage signals;

each of a pair of output resistances of said complementary type driver circuit is smaller than a DC resistance of each of said one pair of wirings; and each of a pair of input resistances of said differential type current sense circuit, as viewed from each of said one pair of input terminals, is smaller than said DC resistance of each of said one pair of wirings.

7. A semiconductor integrated circuit device according to claim 6, wherein said complementary type current sense circuit includes:

a first transistor having a first base connected to a first constant voltage, a first emitter connected to the second end of one of said pair of wirings, and a first collector connected to one of output terminals of said pair of wirings;

a first resistive element connected to said first collector and a first voltage source;

a first current source connected to said first emitter and a second voltage source, for supplying a bias current to said first transistor;

a second transistor having a second base connected to said first constant voltage, a second emitter connected to the second end of the other one of said pair of wirings, and a second collector connected to the other of said output terminals of said pair of wirings;

a second resistive element connected to said second collector and said first voltage source; and a second current source connected to said second emitter and said second voltage source, for supplying a bias current to said second transistor.

8. A semiconductor integrated circuit device according to claim 4, wherein said transistor is a bipolar transistor, and said current source includes an MIS transistor.

9. A semiconductor integrated circuit device according to claim 8, wherein said resistive element includes an MIS transistor.

10. A semiconductor integrated circuit device according to claim 9, further comprising a voltage amplifying circuit connected to said collector of said transistor and constructed of a plurality of MIS transistors.

11. A semiconductor integrated circuit device according to claim 5 wherein said first and second transistors are bipolar transistors, and said current source includes an MIS transistor.

12. A semiconductor integrated circuit device according to claim 11, wherein said current source comprises a parallel connection of an MIS transistor and a resistor.

13. A semiconductor integrated circuit device according to claim 12, wherein said resistive element comprises a parallel connection of an MIS transistor and a resistor.

14. A semiconductor integrated circuit device according to claim 7, wherein said first and second transistors are bipolar transistors, and said first and second current sources include an MIS transistor, respectively.

15. A semiconductor integrated circuit device according to claim 3, wherein said current sense circuit comprises a MIS transistor circuit.

16. A semiconductor integrated circuit device according to claim 15, wherein said MIS transistor circuit includes:

a first MIS transistor having a gate connected to a first constant voltage, a source connected to the second end of said second wiring, and a drain connected to an output terminal;

a resistive element provided between said drain and a first voltage source; and a second MIS transistor connected between said source of the first MIS transistor and a second voltage source.

17. A semiconductor integrated circuit device according to claim 3, wherein said second driver circuit includes:

an emitter coupled logic circuit capable of responding to an output signal of said third logic circuit; and, an emitter follower circuit having an emitter connected to the first end of said second wiring, for inputting therein an output of said emitter coupled logic circuit.

18. A semiconductor integrated circuit device according to claim 3, wherein said second driver circuit comprises a complementary MIS transistor circuit.

19. A semiconductor integrated circuit device according to claim 18, wherein said complementary MIS transistor circuit includes:

a first P type MIS transistor having a drain connected to the first end of said second wiring, a source connected to a first voltage source, and a gate to which the output signal of said third logic circuit is applied; and a second N type MIS transistor having a source connected to a second voltage source, a drain connected to the first end of said second wiring, and a gate to which said output signal of said third logic circuit is applied.

20. A semiconductor integrated circuit device, comprising:

a substrate comprised of semiconductor;

a plurality of logic circuits formed on said semiconductor substrate;

at least one wiring formed on said semiconductor substrate, and transferring a signal between first and second logic circuits within said plurality of logic circuits;

a driver circuit having an output terminal connected to a first end of said wiring, and outputting to said output terminal, a voltage signal corresponding to a voltage signal outputted from said first logic circuit; and a current sense circuit having an input terminal connected to a second end of said wiring, and outputting a voltage signal in correspondence with a current signal flowing into said input terminal, wherein said second logic circuit is connected to said current sense circuit and receives, as an input, said voltage signal supplied from said current sense circuit, wherein an output resistance of said driver circuit is smaller than a DC resistance of said wiring, and wherein an input resistance of said current sense circuit, as viewed from said input terminal, is smaller than said DC resistance of said wiring.

21. A semiconductor integrated circuit device according to claim 20, wherein said current sense includes:

a transistor having a base connected to a substantially constant voltage, an emitter connected to the second end of said wiring, and a collector connected to said second logic circuit;

a resistive element provided between said collector and a first voltage source; and a current source connected to said emitter of said transistor and a second voltage source, and supplying a bias current to said transistor.

22. A semiconductor integrated circuit device according to claim 20, wherein said current sense circuit includes:

a first transistor having a base and collector mutually connected to said wiring, and an emitter connected to a first voltage source;

a second transistor having a base connected to both said base and said collector of said first transistor, an emitter connected to said first voltage source, and a collector providing a voltage signal to said second logic circuit;

a current source provided between said collector of said first transistor and a second voltage source; and a resistive element provided between said collector of said second transistor and said second voltage source.

23. A semiconductor integrated circuit device according to claim 20, wherein:

said wiring comprises at least one pair of wirings formed on said semiconductor substrate;

said driver circuit comprises a complementary type driver circuit having one pair of output terminals connected to first ends of said one pair of wirings, and outputting to said one pair of output terminals, one pair of complementary voltage signals corresponding to a voltage signal outputted by said first logic circuit;

said current sense circuit comprises a differential current sense circuit having one pair of input terminals connected to second ends of said one pair of wirings, outputting one pair of complementary voltage signals in correspondence with a difference between one pair of current signals which flow into said one pair of input terminals;

said second logic circuit is connected to said differential current sense circuit and receives, as an input, said one pair of voltage signals supplied from said differential current sense circuit and responds to a difference between said one pair of complementary voltage signals;

each of a pair of output resistances of said complementary type driver circuit is smaller than a DC resistance of each of said one pair of wirings; and each of a pair of input resistances of said differential current sense circuit, as viewed from each of said one pair of input terminals, is smaller than said DC resistance of each of said one pair of wirings.

24. A semiconductor integrated circuit device according to claim 23, wherein said differential current sense circuit includes:

a first transistor having a first base connected to a first constant voltage, a first emitter connected to the second end of one of said pair of wirings, and a first collector connected to one of output terminals of said pair of wirings;

a first resistive element connected to said first collector and a first voltage source;

a first current source connected to said first emitter and a second voltage source, for supplying a bias current to said first transistor;

a second transistor having a second base connected to said first constant voltage, a second emitter connected to the second end of the other one of said pair of wirings, and a second collector connected to the other of said output terminals of said pair of wirings;

a second resistive element connected to said second collector and said first voltage source; and a second current source connected to said second emitter and said second voltage source, for supplying a bias current to said second transistor.

25. A semiconductor integrated circuit device according to claim 21, wherein said transistor is a bipolar transistor, and said current source includes an MIS transistor.

26. A semiconductor integrated circuit device according to claim 25, wherein said resistive element includes an MIS transistor.

27. A semiconductor integrated circuit device according to claim 26, further comprising a voltage amplifying circuit connected to said collector of the transistor and constructed of a plurality of MIS transistors.

28. A semiconductor integrated circuit device according to claim 22, wherein said first and second transistors are bipolar transistors, and said current source includes an MIS transistor.

29. A semiconductor integrated circuit device according to claim 28, wherein said current source comprises a parallel connection of an MIS transistor and a resistor.

30. A semiconductor integrated circuit device according to claim 29, wherein said resistive element comprises a parallel connection of an MIS transistor and a resistor.

31. A semiconductor integrated circuit device according to claim 24, wherein said first and second transistors are bipolar transistors, and said first and second current sources include an MIS transistor, respectively.

32. A semiconductor integrated circuit device according to claim 20, wherein said current sense circuit comprises a MIS transistor circuit.

33. A semiconductor integrated circuit device according to claim 32, wherein said MIS transistor circuit includes:

a first MIS transistor having a gate connected to a first constant voltage, a source connected to the second end of said wiring, and a drain connected to an output terminal;

a resistive element provided between said drain and a first voltage source; and a second MIS transistor connected between said source of the first MIS transistor and a second voltage source.

34. A semiconductor integrated circuit device according to claim 20, wherein said driver circuit includes:

an emitter coupled logic circuit capable of responding to an output signal of said first logic circuit; and an emitter follower circuit having an emitter connected to the first end of said wiring, for inputting therein an output of said emitter coupled logic circuit.

35. A semiconductor integrated circuit device according to claim 20, wherein said second driver circuit comprises a complementary MIS transistor circuit.

36. A semiconductor integrated circuit device according to claim 35, wherein said complementary MIS transistor circuit includes:

a first P type MIS transistor having a drain connected to the first end of said wiring, a source connected to a first voltage source, and a gate to which the output signal of said first logic circuit is applied; and a second N type MIS transistor having a source connected to a second voltage source, a drain connected to the first end of said second wiring, and a gate to which said output signal of said first logic circuit is applied.

37. A semiconductor integrated circuit device comprising:

a substrate comprised of semiconductor;

a plurality of logic circuits formed on said semiconductor substrate;

at least one pair of wirings formed on said semiconductor substrate, and transferring a signal between first and second logic circuits included in said plurality of logic circuits;

a driver circuit having one pair of output terminals connected to first ends of said one pair of wirings, and outputting to said one pair of output terminals, one pair of complementary voltage signals corresponding to a voltage signal outputted by said first logic circuit; and a current sense circuit having one pair of input terminals connected to second ends of said one pair of wirings, outputting one pair of complementary voltage signals in correspondence with a difference between one pair of current signals which flow into said one pair of input terminals, wherein the second logic circuit is connected to said current sense circuit and receives, as an input, said one pair of complementary voltage signals supplied from said current sense circuit and responds to a difference between said one pair of voltage signals, wherein each of a pair of output resistances of said driver circuit is smaller than a DC resistance of each of said one pair of wirings, and wherein each of a pair of input resistances of said current sense circuit, as viewed from each of said one pair of input terminals, is smaller than said DC resistance of each of said one pair of wirings.

38. A semiconductor integrated circuit device according to claim 37, wherein said current sense circuit includes:

a first transistor having a first base connected to a first constant voltage, an emitter connected to the second end of one of said pair of wirings, and a first collector connected to one of output terminals of said pair of wirings;

a first resistive element connected to said first collector and a first voltage source;

a first current source connected to said first emitter and a second voltage source, for supplying a bias current to said first transistor;

a second transistor having a second base connected to said first constant voltage, a second emitter connected to the second end of the other of said pair of wirings, and a second collector connected to the other of said output terminals of said pair of wirings;

a said second resistive element connected to second collector and said first voltage source; and a second current source connected to said second emitter and said second voltage source, for supplying a bias current to said first transistor.

39. A semiconductor integrated circuit device according to claim 37, wherein said driver circuit includes:

an emitter coupled logic circuit for outputting one pair of voltage signals in response to the output signal of said first logic circuit; and an emitter follower circuit having one pair of bases into which said one pair of voltage signals are inputted, and having one pair of emitters connected to said one pair of wirings.

* * * * *